US012593589B2

(12) United States Patent
Choi et al.

(10) Patent No.: US 12,593,589 B2
(45) Date of Patent: Mar. 31, 2026

(54) DISPLAY DEVICE AND METHOD OF MANUFACTURING THE SAME

(71) Applicant: SAMSUNG DISPLAY CO., LTD., Yongin-si (KR)

(72) Inventors: Young-Gil Choi, Cheonan-si (KR); Changmo Koo, Yongin-si (KR); Gwang-Hee Kim, Asan-si (KR); Jae-Myong Kim, Incheon (KR); Jungkwon Kim, Cheonan-si (KR); Byoungduk Lee, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 545 days.

(21) Appl. No.: 17/658,104

(22) Filed: Apr. 6, 2022

(65) Prior Publication Data

US 2022/0393135 A1     Dec. 8, 2022

(30) Foreign Application Priority Data

Jun. 8, 2021     (KR) ........................ 10-2021-0074355

(51) Int. Cl.
*H10K 59/38*     (2023.01)
*H10K 59/80*     (2023.01)
*H10K 59/12*     (2023.01)

(52) U.S. Cl.
CPC ......... *H10K 59/38* (2023.02); *H10K 59/8731* (2023.02); *H10K 59/8792* (2023.02); *H10K 59/1201* (2023.02)

(58) Field of Classification Search
CPC ............. H10K 71/00; H10K 2102/331; H10K 50/115; H10K 50/846; H10K 50/858;
(Continued)

(56) References Cited

U.S. PATENT DOCUMENTS

| | | | |
|---|---|---|---|
| 8,772,052 B2 | 7/2014 | Miyazawa et al. | |
| 9,559,338 B2 | 1/2017 | Ma et al. | |

(Continued)

FOREIGN PATENT DOCUMENTS

| | | | | |
|---|---|---|---|---|
| KR | 10-2019-0014962 A | | 2/2019 | |
| KR | 20190014962 A | * | 2/2019 | ......... H01L 51/5253 |

(Continued)

OTHER PUBLICATIONS

For Translation of KR-102369369-B1 (Year: 2022).*
(Continued)

*Primary Examiner* — Jacob Y Choi
*Assistant Examiner* — Ashley Nicole Blackwell
(74) *Attorney, Agent, or Firm* — F. CHAU & ASSOCIATES, LLC

(57) ABSTRACT

A display device includes a first area in which a foreign substance is disposed and a second area in which the foreign substance is not disposed. The display device includes a lower panel including a base layer, a display element layer, and an encapsulation layer, an upper panel disposed on the lower panel and including a light control layer and a color filter layer, and a filling layer filling a space between the lower panel and the upper panel. A distance between the display element layer and the light control layer in the first area is greater than a distance between the display element layer and the light control layer in the second area. Accordingly, defects caused by the foreign substance are prevented, and a display quality and a reliability of the display device are increased.

5 Claims, 13 Drawing Sheets

(58) Field of Classification Search
CPC ...... H10K 59/122; H10K 59/35; H10K 59/38;
H10K 59/879; H10K 71/50; H10K
71/861; H10K 50/844; H10K 59/12;
H10K 59/8731; H10K 59/8792; H10K
59/1201; H10K 59/13; H10K 50/11;
H10K 50/125; H10K 71/70; G01N 21/88;
G09G 5/10
See application file for complete search history.

(56) References Cited

U.S. PATENT DOCUMENTS

| | | | |
|---|---|---|---|
| 9,837,640 B2 | 12/2017 | Hayashida et al. | |
| 10,892,309 B2 | 1/2021 | Kim et al. | |
| 11,092,842 B2 | 8/2021 | Kim et al. | |
| 2006/0227084 A1* | 10/2006 | Cok | H10K 71/70 |
| | | | 345/82 |

| | | | | |
|---|---|---|---|---|
| 2010/0140644 A1* | 6/2010 | Kai | H10K 71/00 | |
| | | | 257/E33.059 | |
| 2019/0372052 A1* | 12/2019 | Kishimoto | H10K 59/1213 | |
| 2020/0335562 A1* | 10/2020 | Kim | H10K 59/122 | |

FOREIGN PATENT DOCUMENTS

| | | | | |
|---|---|---|---|---|
| KR | 10-2093627 | 3/2020 | | |
| KR | 10-2020-0120793 A | 10/2020 | | |
| KR | 1020200122466 | 10/2020 | | |
| KR | 102369369 B1 * | 3/2022 | ............. | H01L 51/52 |
| WO | 2010092749 | 8/2010 | | |

OTHER PUBLICATIONS

Translation for KR-20190014962-A, Hyung et al., "Organic Light Emitting Display Device and Method for Manufacturing the Same" (Year: 2019).*

* cited by examiner

S600

DISPLAY DEVICE AND METHOD OF MANUFACTURING THE SAME

CROSS-REFERENCE TO RELATED APPLICATION

The present application claims priority under 35 U.S.C. § 119 to Korean Patent Application No. 10-2021-0074355, filed on Jun. 8, 2021, the contents of which are hereby incorporated by reference in its entirety.

TECHNICAL FIELD

The present disclosure relates to a display device and a method of manufacturing the same. More particularly, the present disclosure relates to a display device including a filling layer between panels and a method of manufacturing the display device.

DISCUSSION OF THE RELATED ART

Display devices including an organic electroluminescent material or a quantum dot light emitting material have been developed. Since the light emitting material is vulnerable to environmental contamination, such as by oxygen and/or moisture, such display devices may utilize functional layers to protect the light emitting material from the external environment.

Foreign substances are often introduced into the display device during a display device manufacturing process, such as a process of forming the functional layers or forming other elements of the display device, and the light emitting material is, at this time, exposed to the external environment due to cracks caused by the introduced foreign substances. As a result, a display quality or reliability of the display device may be deteriorated.

SUMMARY

A display device includes a first area in which a foreign substance is disposed and a second area in which the foreign substance is not disposed. The display device includes a lower panel including a base layer, a display element layer disposed on the base layer, and an encapsulation layer disposed on the display element layer, an upper panel disposed on the lower panel and including a light control layer and a color filter layer, and a filling layer filling a space between the lower panel and the upper panel. A distance between the display element layer and the light control layer in the first area is greater than a distance between the display element layer and the light control layer in the second area.

The foreign substance may be disposed between the display element layer and the light control layer.

The encapsulation layer may include a first inorganic layer disposed on the display element layer, a second inorganic layer disposed on the first inorganic layer, and an organic layer disposed between the first inorganic layer and the second inorganic layer. The foreign substance may be disposed between the display element layer and the first inorganic layer, between the first inorganic layer and the organic layer, and/or between the first inorganic layer and the second inorganic layer.

The foreign substance may have an average particle size that is equal to or greater than about 3 μm and equal to or smaller than about 10 μm.

The filling layer may include a protruding area protruded toward the light control layer and corresponding to the first area.

The filling layer in the first area may have an average thickness that is equal to or greater than an average thickness of the filling layer in the second area.

The filling layer may have an average thickness that is equal to or greater than about 3 μm and equal to or smaller than about 5 μm.

The filling layer may include an auxiliary filling portion adjacent to the foreign substance and a main filling portion covering the auxiliary filling portion.

The auxiliary filling portion and the main filling portion may be integrally provided with each other.

The main filling portion may be formed of a filling resin including an epoxy resin, and the auxiliary filling portion may be formed of an auxiliary filling resin including the epoxy resin and an organic bead.

The main filling portion may be formed of a filling resin including a first epoxy resin, and the auxiliary filling portion may be formed of an auxiliary filling resin including a second epoxy resin having a viscosity that is higher than that of the first epoxy resin.

The auxiliary filling portion may overlap the foreign substance and may cover the foreign substance, and the main filling portion may cover the auxiliary filling portion.

The display element layer may include a first electrode, a second electrode facing the first electrode, and a light emitting layer disposed between the first electrode and the second electrode and including a fluorescent material or a phosphorescent material.

The display element layer may include a light emitting element emitting blue light, and the light control layer may include a first light control portion including a first quantum dot that converts the blue light to red light, a second light control portion including a second quantum dot that converts the blue light to green light, and a third light control portion transmitting the blue light.

The color filter layer may include a first filter transmitting the red light and disposed on the first light control portion, a second filter transmitting the green light and disposed on the second light control portion, and a third filter transmitting the blue light.

A display device includes a lower panel including a foreign substance area in which a foreign substance is disposed, an upper panel disposed on the lower panel and including a light control layer and a color filter layer, and a filling layer filling a space between the lower panel and the upper panel and including a protruding area protruded toward the upper panel and corresponding to the foreign substance area.

The protruding area may protrude toward the upper panel and may correspond to a shape of the foreign substance.

The foreign substance may be disposed between the filling layer and the lower panel.

A method of manufacturing a display device includes detecting a position of a foreign substance in a lower panel including a foreign substance area in which the foreign substance is disposed, disposing an auxiliary filling resin on the lower panel to correspond to the foreign substance area, disposing a filling resin on one surface of an upper panel including a light control layer, arranging the lower panel to the upper panel, curing the filling resin disposed between the lower panel and the upper panel arranged to the lower panel to form a filling layer, and correcting a brightness of an area in which the foreign substance is included.

The correcting of the brightness may include measuring a first brightness of a first area in which the foreign substance is included and measuring a second brightness of a second area in which the foreign substance is not included, comparing the first brightness of the first area with the second brightness of the second area, and compensating for the first brightness to obtain a correction brightness with respect to the second brightness.

The auxiliary filling resin may be a same material as the filling resin.

The auxiliary filling resin may be cured in a same process as the filling resin.

The auxiliary filling resin may be provided in a dot shape in the foreign substance area to be adjacent to the foreign substance.

The filling resin may be provided in a dot shape over one surface of the light control layer adjacent to the lower panel.

The method may further include curing the auxiliary filling resin before the arranging of the lower panel to the upper panel.

BRIEF DESCRIPTION OF THE DRAWINGS

The above and other aspects of the present disclosure will become readily apparent by reference to the following detailed description when considered in conjunction with the accompanying drawings wherein.

DETAILED DESCRIPTION

Figure 1:
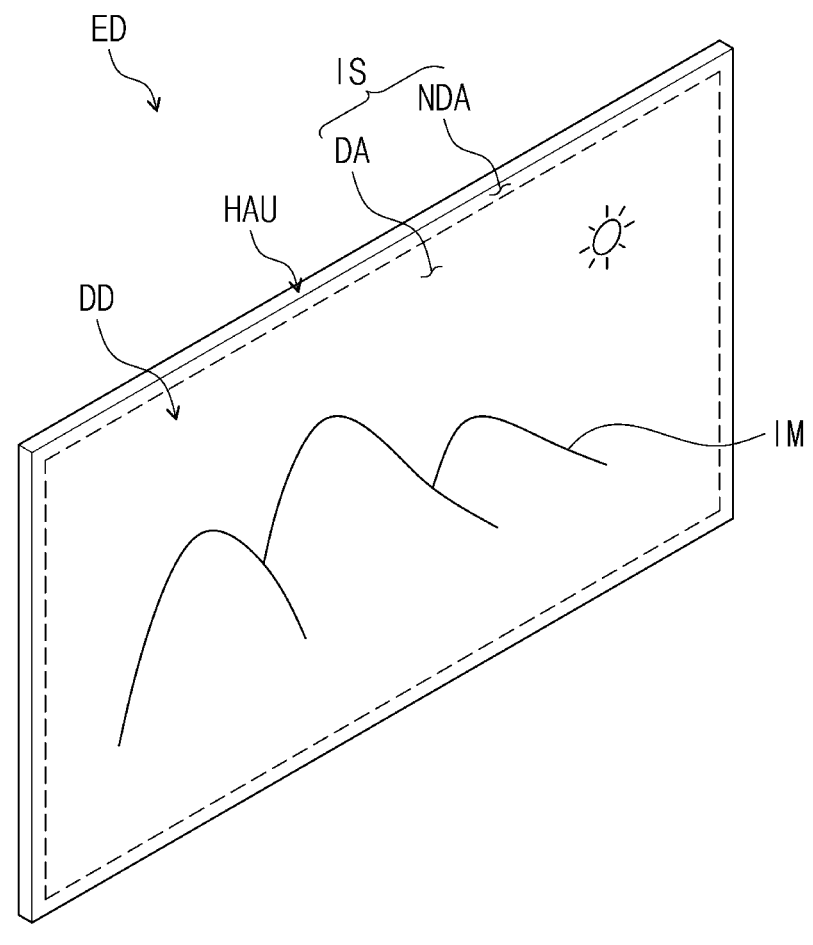
FIG. 1 is a perspective view showing an electronic device according to an embodiment of the present disclosure.
Figure 1:
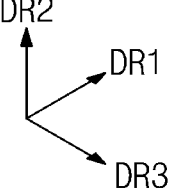

The present disclosure may be variously modified and realized in many different forms, and thus specific embodiments will be exemplified in the drawings and described in detail hereinbelow. However, the present disclosure should not necessarily be limited to the specific disclosed forms, and should be construed to include all modifications, equivalents, or replacements included in the spirit and scope of the present disclosure.

It will be understood that when an element (or area, layer, or portion) is referred to as being "on", "connected to" or "coupled to" another element or layer, it can be directly on, connected or coupled to the other element or layer or intervening elements or layers may be present.

In the present disclosure, the expression "directly disposed" means that no intervening element, such as layer, film, area, or plate, between the element and other elements. For example, the expression "directly disposed" means that two layers or two elements are disposed with no additional elements, such as an adhesive, disposed therebetween.

Like numerals may refer to like elements throughout the specification and the drawings. In the drawings, the thicknesses, ratios, angles, and dimensions of components may represent one example embodiment of the present disclosure but these thicknesses, ratios, angles, and dimensions may be modified to meet the various needs of performing the disclosure.

As used herein, the term "and/or" includes any and all combinations of one or more of the associated listed items.

It will be understood that, although the terms first, second, etc. may be used herein to describe various elements, these elements should not necessarily be limited by these terms. These terms are used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "comprises," "comprising," "includes," and/or "including", when used in this specification, specify the presence of stated features, integers, steps, operations, elements, and/or components, but do not necessarily preclude the presence or addition of one or more other features, integers, steps, operations, elements, components, and/or groups thereof.

Hereinafter, a display device and a method of manufacturing the display device according to the present disclosure will be explained in detail with reference to the accompanying drawings.

Figure 2:
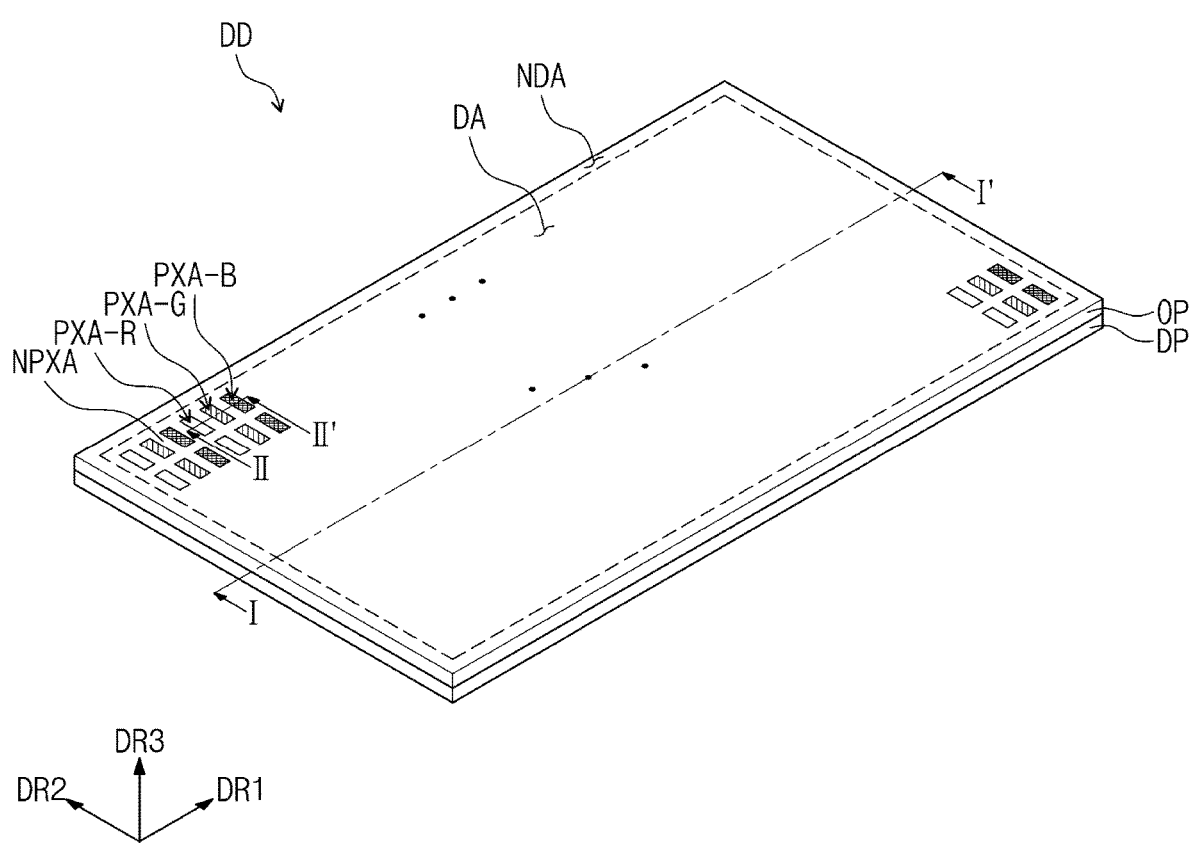
FIG. 2 is a perspective view showing a display device according to an embodiment of the present disclosure.
Figure 3:
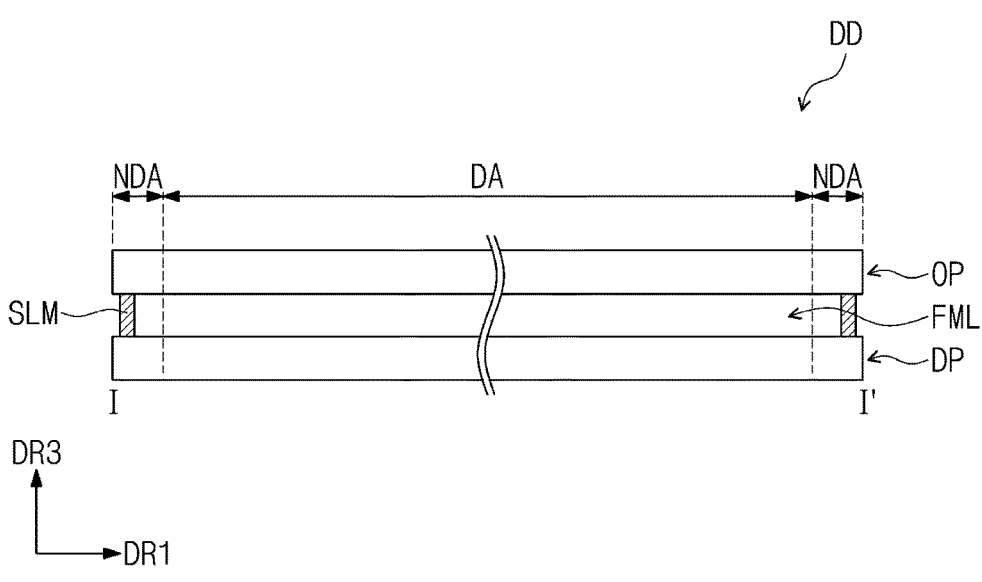
FIG. 3 is a cross-sectional view showing a display device according to an embodiment of the present disclosure.

FIG. 1 is a perspective view showing an electronic device ED according to an embodiment of the present disclosure. FIG. 2 is a perspective view showing a display device DD according to an embodiment of the present disclosure. FIG. 3 is a cross-sectional view taken along a line I-I' of FIG. 2.

According to an embodiment, the electronic device ED may be a large-sized electronic device, such as a television, a computer monitor, or an outdoor billboard. In addition, the electronic device may be a small and medium-sized electronic item, such as a personal computer, a notebook computer, a personal digital assistant, a car navigation unit, a game console, a smartphone, a tablet computer, and a digital camera. These are merely examples, and the electronic device ED may be applied to other electronic items as long as they do not depart from the concept of the present disclosure.

The electronic device ED may include a display device DD and a housing HAU. The housing HAU may accommodate the display device DD. The housing HAU may cover the display device DD such that an upper surface corresponding to a display surface IS of the display device DD is exposed. The housing HAU may cover a side surface and a bottom surface of the display device DD and may expose an entire area of the upper surface of the display device DD, however, the present invention is not necessarily limited to having such a configuration. The housing HAU may cover a portion of the upper surface as well as the side surface and the bottom surface of the display device DD.

FIG. 1 and the following drawings show first, second, and third directional axes DR1, DR2, and DR3, and directions indicated by the first, second, and third directional axes DR1, DR2, and DR3 may be relative to each other and may be changed. In addition, the directions indicated by the first, second, and third directional axes DR1, DR2, and DR3 may be referred to as first, second, and third directions, respectively, and may be assigned with the same reference numerals as those of the first, second, and third directional axes DR1, DR2, and DR3. In the following descriptions, the first directional axis DR1 may be substantially perpendicular to the second directional axis DR2, and the third directional axis DR3 may be a direction normal to a plane defined by the first directional axis DR1 and the second directional axis DR2.

In the present disclosure, a thickness direction of the electronic device ED or the display device DD may be substantially parallel to the third directional axis DR3 that is normal to the plane defined by the first directional axis DR1 and the second directional axis DR2. In the present embodiment, front (or upper) and rear (or lower) surfaces of each element of display device DD may be defined with respect to the third directional axis DR3.

In FIG. 1, the display surface IS of the electronic device ED is shown as being parallel to the plane defined by the first directional axis DR1 and the second directional axis DR2 crossing the first directional axis DR1, however, this is merely one example. According to an embodiment, the display surface IS of the electronic device ED may have a curved shape.

According to an embodiment, the display device DD may include a display area DA and a non-display area NDA at least partially surrounding the display area DA. The display area DA may correspond to an area through which an image IM is displayed.

According to an embodiment, the display area DA may have a quadrilateral shape. The non-display area NDA may fully surround the display area DA, however, the present invention is not necessarily limited to this arrangement and the non-display area NDA may contact the display area DA on three, two, or one side thereof. According to an embodiment, a shape of the display area DA and a shape of the non-display area NDA may be designed relative to each other. In addition, the non-display area NDA might not be defined in the display surface IS that is a front surface of the display device DD.

Figure 4:
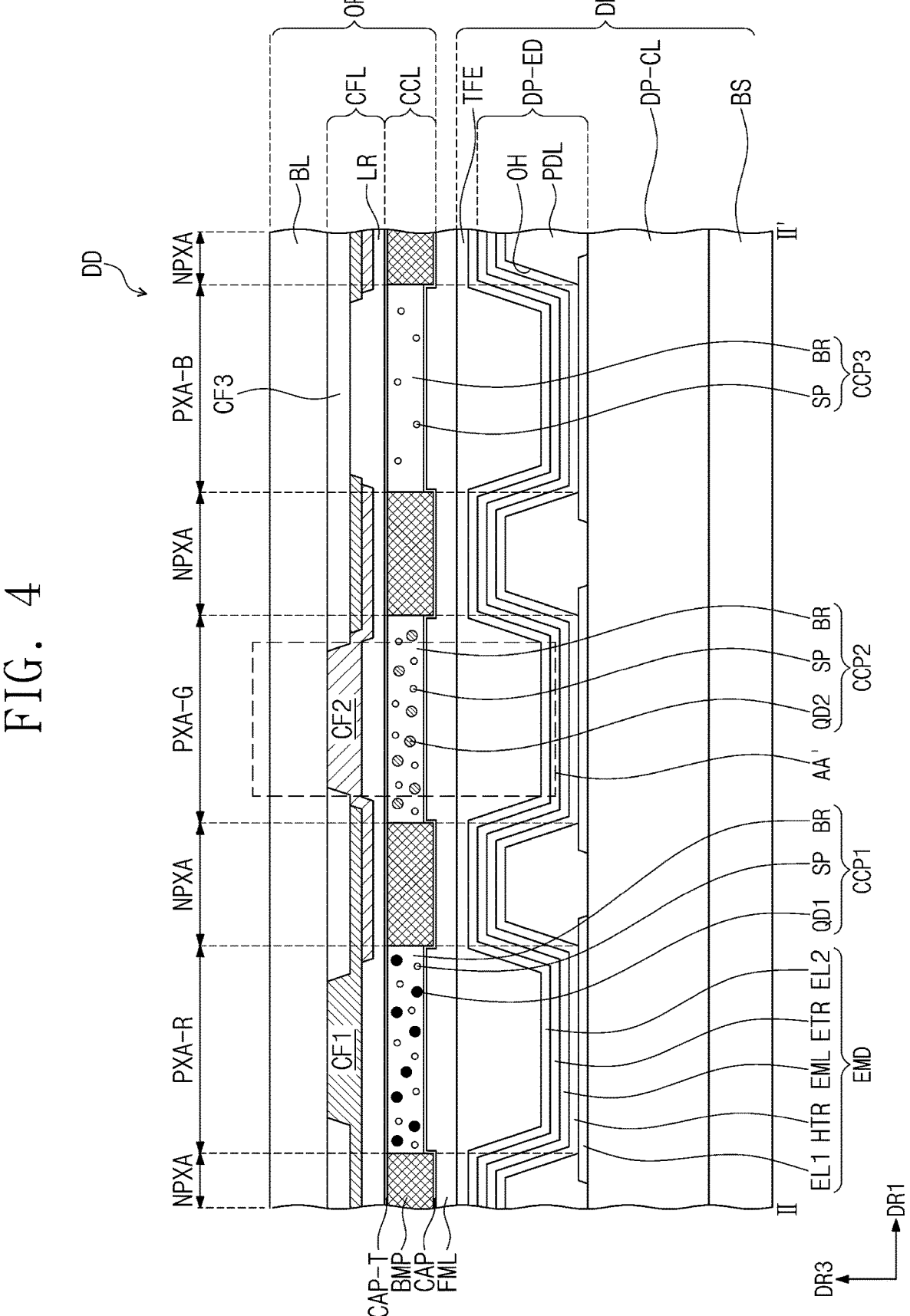
FIG. 4 is a cross-sectional view showing a display device according to an embodiment of the present disclosure.

According to an embodiment, the display device DD may include a display panel DP and a light control panel OP. According to an embodiment, a filling layer FML, may be disposed between the display panel DP and the light control panel OP. The display panel DP may be a lower panel including a display element layer DP-ED (refer to FIG. 4), and the light control panel OP may be an upper panel including a light control layer CCL (refer to FIG. 4). Referring to FIG. 4, the display panel DP that is the lower panel may include a base layer BS, the display element layer DP-ED disposed on the base layer BS, and an encapsulation layer TFE disposed on the display element layer DP-ED, and the light control panel OP that is the upper panel may include the light control layer CCL and a color filter layer CFL. The upper panel may be disposed above the lower panel with the filling layer FML interposed therebetween.

According to an embodiment, the display device DD may include a plurality of light emitting areas PXA-R, PXA-G, and PXA-B. The display device DD may include first, second, and third light emitting areas PXA-R, PXA-G, and PXA-B. As an example, the display device DD may include the first light emitting area PXA-R, the second light emitting area PXA-G, and the third light emitting area PXA-B, which are distinct from each other. According to an embodiment, the first light emitting area PXA-R may be a red light emitting area emitting red light, the second light emitting area PXA-G may be a green light emitting area emitting green light, and the third light emitting area PXA-B may be a blue light emitting area emitting blue light.

The first, second, and third light emitting areas PXA-R, PXA-G, and PXA-B may be distinct from each other without overlapping each other when viewed in a plane (e.g., in a plan view). As an example, the non-light emitting area NPXA may be disposed between the light emitting areas PXA-R, PXA-G, and PXA-B adjacent to each other.

FIG. 2 shows a structure in which the light emitting areas PXA-R, PXA-G, and PXA-B of the display device DD are arranged in a stripe form. For example, in the display device DD shown in FIG. 2, each of a plurality of first light emitting areas PXA-R, a plurality of second light emitting areas PXA-G, and a plurality of third light emitting areas PXA-B may be arranged in the second directional axis DR2. In addition, the light emitting areas PXA-R, PXA-G, and PXA-B may be alternately arranged in the first directional axis DR1 in the order of the first light emitting area PXA-R, the second light emitting area PXA-G, and the third light emitting area PXA-B.

The arrangement of the light emitting areas PXA-R, PXA-G, and PXA-B should not necessarily be limited to that shown in FIG. 2, and the arrangement order of the first light emitting area PXA-R, the second light emitting area PXA-G, and the third light emitting area PXA-B may be provided in various combinations according to characteristics of a display quality required for the display device DD. As an example, the arrangement of the light emitting areas PXA-R, PXA-G, and PXA-B may be a PENTILE® structure, where PENTILE is an arrangement of five subpixels developed by Samsung, or a lozenge structure.

According to an embodiment, the light emitting areas PXA-R, PXA-G, and PXA-B emitting light in different wavelength ranges among the light emitting areas PXA-R, PXA-G, and PXA-B may have different areas from each other. In this case, the area may mean an area defined by the first directional axis DR1 and the second directional axis DR2 when viewed in the plane, however, the present invention should not necessarily be limited thereto or thereby. The light emitting areas PXA-R, PXA-G, and PXA-B may have substantially the same area as each other. In addition, a ratio in area between the light emitting areas PXA-R, PXA-G, and PXA-B may be adjusted in various ways according to the characteristics of the display quality required for the display device DD, and shapes of the light emitting areas PXA-R, PXA-G, and PXA-B may be changed in various ways.

Referring to FIG. 3, the filling layer FML may be filled in between the display panel DP and the light control panel OP in the display device DD. The filling layer FML may combine the display panel DP with the light control panel OP. In addition, the filling layer FML may function as a buffer between the display panel DP and the light control panel OP. In addition, according to an embodiment, the filling layer FML may have an impact absorbing function and may increase a strength of the display device DD. The filling layer FML may be formed of a filling resin including a polymer resin. As an example, the filling layer FML may be formed of a resin, such as an acrylate-based resin or an epoxy-based resin.

According to an embodiment, the display device DD may include a seal SLM disposed between the display panel DP and the light control panel OP. The seal SLM may combine the display panel DP with the light control panel OP. The seal SLM may be disposed in the non-display area NDA to combine the display panel DP with the light control panel OP. The seal SLM may be disposed in the non-display area NDA corresponding to an outer portion of the display device DD to prevent a foreign substance, e.g., oxygen, moisture, or the like from entering the display device DD. The seal SLM may be formed of a sealant including a curable resin. The sealant may include an epoxy-based resin or an acrylate-based resin. The sealant may be a heat curable material or a light curable material. The sealant may be disposed on one surface of the display panel DP or the light control panel OP and may be cured by heat or ultraviolet light after the display panel DP and the light control panel OP are combined to face each other, thereby forming the seal SLM.

Figure 5:
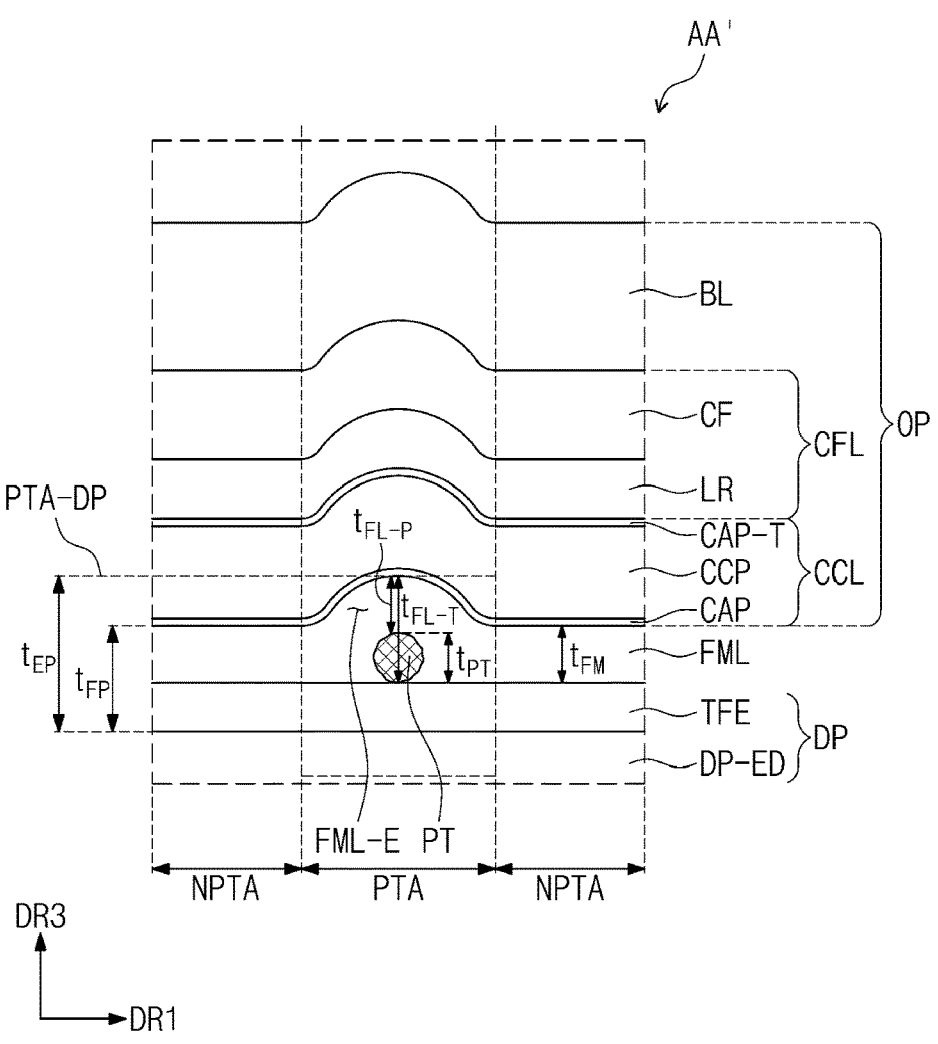
FIG. 5 is a cross-sectional view showing a portion of a display device according to an embodiment of the present disclosure.

FIG. 4 is a cross-sectional view showing the display device DD according to an embodiment of the present disclosure. FIG. 5 is a cross-sectional view showing a portion of the display device DD according to an embodiment of the present disclosure. FIG. 4 is a cross-sectional view taken along a line II-II' of FIG. 2. FIG. 5 is a cross-sectional view showing an area AA' of FIG. 4.

Referring to FIGS. 4 and 5, the display device DD may include a foreign substance PT disposed therein. As used herein, the phrase "foreign substance" refers to any material that has inadvertently entered the apparatus, from the outside, during manufacturing or any material used in producing the apparatus that has migrated to a region of the apparatus that it is not designed to be in. According to an embodiment, the display device DD may include a first area PTA in which the foreign substance PT is disposed and a second area NPTA in which the foreign substance PT is not disposed. According to an embodiment, the display device DD may include the display panel DP, the light control panel OP facing the display panel DP, and the filling layer FML filled in between the display panel DP and the light control panel OP.

In the present disclosure, the foreign substance PT disposed in the display device DD may be particles introduced from the outside or formed during a manufacturing process of the display device. The foreign substance PT may be organic particles, inorganic particles, or composite particles in which organic and inorganic materials are mixed. The type and the shape of the foreign substance PT should not necessarily be particularly limited to the examples discussed herein, and the foreign substance PT may be defined as a substance that is different from each element of the display device DD in the area where the foreign substance PT is located and that has a particle size equal to or greater than a predetermined size. The shape of the foreign substance PT may be arbitrary, and the foreign substance PT may be formed of a material different from that of a layer in which the foreign substance PT is located. The foreign substance PT may have the particle size $t_{PT}$ equal to or greater than about 3 μm and equal to or smaller than about 10 μm.

The particle size $t_{PT}$ of the foreign substance PT may be defined as an average height in the third directional axis DR3 that is the thickness direction of the display device DD. For example, the particle size $t_{PT}$ of the foreign substance PT may correspond to a height in a cross section perpendicular to the base layer BS.

In a case where the particle size $t_{PT}$ of the foreign substance PT is smaller than about 3 μm, the occurrence of cracks caused by the foreign substance PT is reduced, and a display quality is not affected. Accordingly, when the foreign substance PT is smaller than about 3 μm, the area of the display device where the foreign substance PT is located may exhibit the same characteristics as that of the second area NPTA where the foreign substance PT is not included. In addition, in a case where the particle size $t_{PT}$ of the foreign substance PT is greater than about 10 μm, the foreign substance PT might not be covered by employing the filling layer FML described later, and it may be necessary to perform a process of removing the foreign substance PT. According to an embodiment, the display panel DP may include the base layer BS, a circuit layer DP-CL disposed on the base layer BS, and the display element layer DP-ED disposed on the circuit layer DP-CL, and the display element layer DP-ED may include a light emitting element EMD. In addition, the display panel DP may include an encapsulation layer TFE disposed on the display element layer DP-ED.

According to an embodiment, the display panel DP of the display device DD may be a light emitting type display panel. As an example, the display panel DP may be an organic electroluminescent display panel, however, the present invention is not necessarily limited to this particular arrangement. When the display panel DP is the organic electroluminescent display panel, the display element layer DP-ED may include an organic electroluminescent element.

The base layer BS of the display panel DP may be an element that provides a base surface on which the display element layer DP-ED is disposed. The base layer BS may be a glass substrate, a metal substrate, or a polymer substrate. However, the present invention is not necessarily limited to this particular arrangement, and the base layer BS may be an inorganic layer, a functional layer, or a composite material layer.

The base layer BS may have a multi-layer structure. For instance, the base layer BS may have a three-layer structure of a polymer resin layer, an adhesive layer, and a polymer resin layer. The polymer resin layer may include a polyimide-based resin. In addition, the polymer resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. In the present disclosure, the term "X-based resin", as used herein, refers to the resin that includes a functional group of X.

The circuit layer DP-CL may be disposed on the base layer BS. The circuit layer DP-CL may include an insulating layer, a semiconductor pattern, a conductive pattern, and a signal line. An insulating layer, a semiconductor layer, and a conductive layer may be formed on the base layer BS by a coating or depositing process. Then, the insulating layer, the semiconductor layer, and the conductive layer may be selectively patterned through one or more photolithography processes. The semiconductor pattern, the conductive pattern, and the signal line included in the circuit layer DP-CL may be formed. The circuit layer DP-CL may include a transistor, a buffer layer, and a plurality of insulating layers.

The display element layer DP-ED including the light emitting element EMD may be disposed on the circuit layer DP-CL. The display element layer DP-ED may include a pixel definition layer PDL and the light emitting element EMD.

The light emitting element EMD may include a first electrode EL1, a light emitting layer EML, and a second electrode EL2. In addition, the light emitting element EMD may further include a hole transport region HTR and an electron transport region ETR. The light emitting element EMD may further include a capping layer disposed on the second electrode EL2.

The pixel definition layer PDL may be disposed on the circuit layer DP-CL and may cover a portion of the first electrode EL1. The pixel definition layer PDL may be provided with an opening OH defined therethrough. At least a portion of the first electrode EL1 may be exposed through the opening OH of the pixel definition layer PDL. In the present embodiment, the light emitting areas PXA-R, PXA-G, and PXA-B may be defined to correspond to the portion of the first electrode EL1 exposed through the opening OH. The non-light emitting area NPXA may be defined between the light emitting areas PXA-R, PXA-G, and PXA-B. As an example, the non-light emitting area NPXA may surround the light emitting areas PXA-R, PXA-G, and PXA-B.

The first electrode EL1 of the light emitting element EMD may be an anode or a cathode. The first electrode EL1 may be a pixel electrode. The first electrode EL1 may be a transmissive electrode, a transflective electrode, or a reflective electrode. When the first electrode EL1 is the transmissive electrode, the first electrode EL1 may include a transparent metal oxide, for example, indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof, e.g., a mixture of Ag and Mg. In addition, the first electrode EL1 may have a multi-layer structure of a reflective layer or a transflective layer, which is formed of the above materials, and a transparent conductive layer formed of indium tin oxide (ITO), indium zinc oxide (IZO), zinc oxide (ZnO), indium tin zinc oxide (ITZO), etc. As an example, the first electrode EL1 may have a three-layer structure of ITO/Ag/ITO, however, the present invention is not necessarily limited to this particular arrangement.

The hole transport region HTR may be disposed between the first electrode EL1 and the light emitting layer EML. The hole transport region HTR may be disposed as a common layer to entirely overlap the light emitting areas PXA-R, PXA-G, and PXA-B and the non-light emitting area NPXA, however, the present invention is not necessarily limited to this particular arrangement. According to an embodiment, the hole transport region HTR may be patterned to overlap each of the light emitting areas PXA-R, PXA-G, and PXA-B and not to overlap a portion of the non-light emitting area NPXA. The hole transport region HTR may include at least one of a hole injection layer, a hole transport layer, and an electron blocking layer.

The hole transport region HTR may include a phthalocyanine compound, such as copper phthalocyanine, and DNTPD($N^1$,$N^{1'}$-([1,1'-biphenyl]-4,4'-diyl)bis($N^1$-phenyl-$N^4$,$N^4$-di-m-tolylbenzene-1,4-diamine)), m-MTDATA(4,4', 4"-[tris(3-methylphenyl)phenylamino] triphenylamine), TDATA(4,4'4"-Tris(N,N-diphenylamino)triphenylamine), 2-TNATA(4,4',4"-tris[N-(2-naphthyl)-N-phenylamino]-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonicacid), PANI/PSS(Polyaniline/Poly(4-styrenesulfonate)), NPB(N,N'-di(naphthalene-1-yl)-N,N'-diphenyl-benzidine), poly(ether ketone)-containing triphenylamine (TPAPEK), 4-Isopropyl-4'-methyldiphenyliodonium [Tetrakis(pentafluorophenyl)borate], HATCN (dipyrazino[2,3-f:2',3'-h] quinoxaline-2,3,6,7,10,11-hexacarbonitrile), etc.

The hole transport region HTR may include carbazole-based derivatives, e.g., n-phenyl carbazole, polyvinyl carbazole, etc., fluorene-based derivatives, triphenylamine-based derivatives, e.g., TPD(N,N'-bis(3-methylphenyl)-N, N'-diphenyl-[1,1-biphenyl]-4,4'-diamine), TCTA(4,4',4"-tris (N-carbazolyl)triphenylamine), etc., NPB(N,N'-di (naphthalene-1-yl)-N,N'-diphenyl-benzidine), TAPC(4,4'-Cyclohexylidene bis[N,N-bis(4-methylphenyl) benzenamine]), HMTPD(4,4'-Bis[N,N'-(3-tolyl)amino]-3, 3'-dimethylbiphenyl), mCP(1,3-Bis(N-carbazolyl)benzene), etc.

The light emitting layer EML may be disposed on the hole transport region HTR. According to an embodiment, the light emitting layer EML may be provided as a common layer to entirely overlap the light emitting areas PXA-R, PXA-G, and PXA-B and the non-light emitting area NPXA. The light emitting layer EML may emit blue light. The light emitting layer EML may entirely overlap the hole transport region HTR and the electron transport region ETR.

However, the present invention is not necessarily limited to this particular arrangement, and according to an embodiment, the light emitting layer EML may be disposed in the opening OH. For example, the light emitting layer EML may be provided after being divided into plural portions to correspond to the light emitting areas PXA-R, PXA-G, and PXA-B, which are distinct from each other by the pixel definition layer PDL. In the light emitting layer EML divided into plural portions to correspond to the light emitting areas PXA-R, PXA-G, and PXA-B, all the portions of the light emitting layer EML may emit blue light or the portions of the light emitting layer EML may emit light in different wavelength ranges.

The light emitting layer EML may have a single-layer structure of a single material, a single-layer structure of plural different materials, or a multi-layer structure of layers formed of different materials.

The light emitting layer EML may include a fluorescent or phosphorescent material. According to an embodiment, the light emitting layer EML may include anthracene derivatives, pyrene derivatives, fluoranthene derivatives, chrysene derivatives, dihydrobenzanthracene derivatives, or triphenylene derivatives. In addition, the light emitting layer EML may include a metal organic complex as its light emitting material. The light emitting layer EML may include quantum dots as its light emitting material.

The electron transport region ETR may be disposed between the light emitting layer EML and the second electrode EL2. The electron transport region ETR may be provided as a common layer to entirely overlap the light emitting areas PXA-R, PXA-G, and PXA-B and the non-light emitting area NPXA, however, the present invention is not necessarily limited to this particular arrangement. According to an embodiment, the electron transport region ETR may be patterned to overlap the light emitting areas PXA-R, PXA-G, and PXA-B and not to overlap a portion of the non-light emitting area NPXA. The electron transport region ETR may include at least one of an electron injection layer, an electron transport layer, and a hole blocking layer.

The electron transport region ETR may include, for example, $Alq_3$(tris(8-hydroxyquinolinato)aluminum), 1,3,5-tri [(3-pyridyl)-phen-3-yl]benzene, 2,4,6-tris(3'-(pyridin-3-yl)biphenyl-3-yl)-1,3,5-triazine, 2-(4-(N-phenylbenzoimi-dazol-1-yl)phenyl)-9,10-dinaphthylanthracene, TPBi(1,3,5-Tri(1-phenyl-1H-benzo[d]imidazol-2-yl)benzene), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1, O8)-(1,1'-Biphenyl-4-olato)aluminum), $Bebq_2$(berylliumbis(benzoquinolin-10-olate)), ADN(9,10-di(naphthalene-2-yl) anthracene), BmPyPhB(1,3-Bis[3,5-di(pyridin-3-yl)phenyl] benzene), and compounds thereof.

In addition, the electron transport region ETR may include a metal halide, such as LiF, NaCl, CsF, RbCl, RbI, CuI, KI, etc., a lanthanum group metal, such as Yb, or a co-deposition material of the metal halide and a lanthanum group metal. For example, the electron transport region ETR may include KI:Yb or RbI:Yb as the co-deposition material. The electron transport region ETR may include a metal oxide, such as $Li_2O$ or BaO, or Liq(8-hydroxyl-Lithium quinolate), however, the present invention is not necessarily limited to this particular arrangement. The electron transport region ETR may include a mixture of an electron transport material and an insulating organo metal salt.

The second electrode EL2 may be disposed on the electron transport region ETR. The second electrode EL2 may be a common electrode. The second electrode EL2 may be a cathode or an anode, however, the present invention is not necessarily limited to this particular arrangement. As an example, when the first electrode EL1 is the anode, the second electrode EL2 may be the cathode, and when the first electrode EL1 is the cathode, the second electrode EL2 may be the anode.

The second electrode EL2 may be a transmissive electrode, a transflective electrode, or a reflective electrode. When the second electrode EL2 is the transmissive electrode, the second electrode EL2 may include a transparent metal oxide, for example, indium tin oxide (ITO), indium zinc oxide (IZO), zinc oxide (ZnO), and indium tin zinc oxide (ITZO).

The encapsulation layer TFE may be disposed on the light emitting element EMD. As an example, the encapsulation layer TFE may be disposed on the second electrode EL2. In addition, in a case where the light emitting element EMD includes the capping layer, the encapsulation layer TFE may be disposed on the capping layer. The encapsulation layer TFE may include at least one organic layer and at least one inorganic layer, and the inorganic layer and the organic layer may be alternately stacked with each other.

Figure 6:
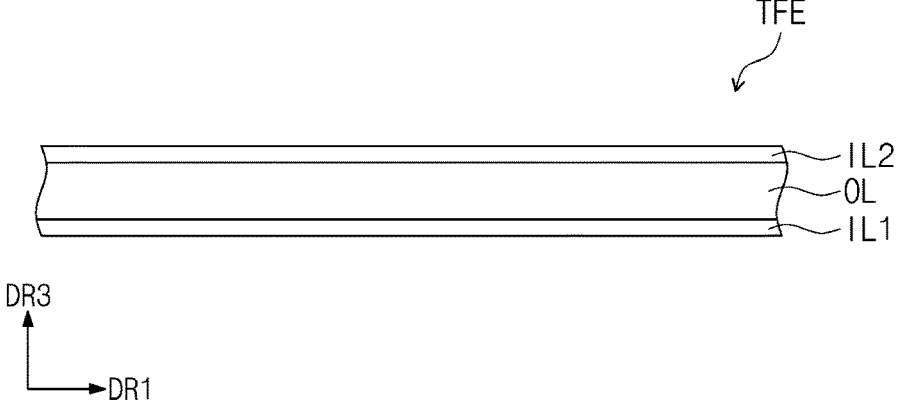
FIG. 6 is a cross-sectional view showing an encapsulation layer according to an embodiment of the present disclosure.

FIG. 6 is a cross-sectional view showing the encapsulation layer TFE according to an embodiment of the present disclosure.

Referring to FIG. 6, the encapsulation layer TFE may include two inorganic layers IL1 and IL2 and an organic layer OL disposed between the inorganic layers IL1 and IL2. The two inorganic layers IL1 and IL2 may include a first inorganic layer IL1 and a second inorganic layer IL2. The first inorganic layer IL1, the organic layer OL, and the second inorganic layer IL2 may protect the display element layer DP-ED from moisture and oxygen and may prevent a foreign substance such as dust particles from entering therethrough.

The first inorganic layer IL1 and the second inorganic layer IL2 of the encapsulation layer TFE may include silicon nitride, silicon oxynitride, and/or silicon oxide. As an example, the first inorganic layer IL1 and the second inorganic layer IL2 may include titanium oxide or aluminum oxide, however, the present invention is not necessarily limited to this particular arrangement.

The organic layer OL of the encapsulation layer TFE may be disposed between the first inorganic layer IL1 and the second inorganic layer IL2 and may include an organic polymer material. As an example, the organic layer OL may include an acrylate-based resin. The organic layer OL may have a thickness that is greater than a thickness of the inorganic layers IL1 and IL2 adjacent thereto.

FIG. 6 shows a structure of the encapsulation layer TFE including two inorganic layers IL1 and IL2 and one organic layer OL disposed between the inorganic layers IL1 and IL2, however, the present invention is not necessarily limited to this particular arrangement. As an example, the encapsulation layer TFE may include a plurality of organic layers and a plurality of inorganic layers, and the inorganic layers may be alternately arranged with the organic layers.

Referring to FIGS. 4 and 5, the light control panel OP including the light control layer CCL and the color filter layer CFL may be disposed on the display panel DP.

The light control layer CCL may include a light converter. The light converter may be a quantum dot or a fluorescent substance. The light converter may emit a light incident thereto after converting a wavelength of the light. For example, the light control layer CCL may be a layer including the quantum dot or the fluorescent substance.

The light control layer CCL may include a plurality of light control portions CCP1, CCP2, and CCP3. The light control portions CCP1, CCP2, and CCP3 may be spaced apart from each other.

Referring to FIG. 4, a partition pattern BMP may be disposed between the light control portions CCP1, CCP2, and CCP3 spaced apart from each other, however, the present invention is not necessarily limited to this particular arrangement. In FIG. 4, the partition pattern BMP is shown as not overlapping the light control portions CCP1, CCP2, and CCP3, however, edges of the light control portions CCP1, CCP2, and CCP3 may overlap at least a portion of the partition pattern BMP.

The light control layer CCL may include a first light control portion CCP1 including a first quantum dot QD1 that converts a first color light provided from the light emitting element EMD to a second color light, a second light control portion CCP2 including a second quantum dot QD2 that converts the first color light to a third color light, and a third light control portion CCP3 that transmits the first color light.

According to an embodiment, the first light control portion CCP1 may provide red light as the second color light, and the second light control portion CCP2 may provide green light as the third color light. The third light control portion CCP3 may transmit blue light that is the first color light provided from the light emitting element EMD. As an example, the first quantum dot QD1 may be a red quantum dot, and the second quantum dot QD2 may be a green quantum dot.

In addition, the light control layer CCL may further include a scatterer SP. The first light control portion CCP1 may include the first quantum dot QD1 and the scatterer SP, the second light control portion CCP2 may include the second quantum dot QD2 and the scatterer SP, and the third light control portion CCP3 may include the scatterer SP without including any quantum dots.

The scatterer SP may be an inorganic particle. As an example, the scatterer SP may include at least one of $TiO_2$, ZnO, $Al_2O_3$, $SiO_2$, and a hollow silica particle. The scatterer SP may include one of $TiO_2$, ZnO, $Al_2O_3$, $SiO_2$, and the hollow silica particle or may include two or more of $TiO_2$, ZnO, $Al_2O_3$, $SiO_2$, and the hollow silica, which are mixed with each other.

Each of the first light control portion CCP1, the second light control portion CCP2, and the third light control portion CCP3 may include a base resin BR in which the quantum dots QD1 and QD2 and the scatterer SP are dispersed. According to an embodiment, the first light control portion CCP1 may include the first quantum dot QD1 and the scatterer SP, which are dispersed in the base resin BR, the second light control portion CCP2 may include the second quantum dot QD2 and the scatterer SP, which are dispersed in the base resin BR, and the third light control portion CCP3 may include the scatterer SP dispersed in the base resin BR.

The base resin BR may be a medium in which the quantum dots QD1 and QD2 and the scatterer SP are dispersed and may include various resin compositions that are generally referred to as a binder. As an example, the base resin BR may be an acrylate-based resin, a urethane-based resin, a silicone-based resin, or an epoxy-based resin. The base resin BR may be a transparent resin.

The light control layer CCL may include barrier layers CAP and CAP-T. The barrier layers CAP and CAP-T may prevent moisture and/or oxygen (hereinafter, referred to as moisture/oxygen) from entering. The barrier layers CAP-T and CAP may be disposed on and under the light control portions CCP1, CCP2, and CCP3 to prevent the light control portions CCP1, CCP2, and CCP3 from being exposed to the moisture/oxygen. The barrier layers CAP and CAP-T may cover the light control portions CCP1, CCP2, and CCP3. The barrier layers CAP and CAP-T may cover the light control portions CCP1, CCP2, and CCP3 and the partition pattern BMP.

The barrier layers CAP and CAP-T may include at least one inorganic layer. For example, the barrier layers CAP and CAP-T may include an inorganic material. As an example, the barrier layers CAP and CAP-T may include silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, or a metal thin film having light transmittance. As an example, a lower barrier layer CAP disposed under the light control portions CCP1, CCP2, and CCP3 may include silicon oxynitride, and an upper barrier layer CAP-T disposed on the light control portions CCP1, CCP2, and CCP3 may include silicon oxide, however, the present invention is not necessarily limited to this particular arrangement. In addition, each of the lower barrier layer CAP and the upper barrier layer CAP-T may have a thickness of about 4000 Å.

The barrier layers CAP and CAP-T may further include an organic layer. The barrier layers CAP and CAP-T may have a single-layer or multi-layer structure.

According to an embodiment, even though the foreign substance PT is disposed under the light control panel OP in the display device DD, the foreign substance PT may be covered by the filling layer FML, and accordingly cracks on the lower barrier layer CAP caused by the introduction of the foreign substance PT may be prevented. Accordingly, the light control portions CCP1, CCP2, and CCP3 may be protected by the lower barrier layer CAP.

According to an embodiment, the color filter layer CFL may be disposed on the light control layer CCL in the display device DD. The color filter layer CFL may include filters CF1, CF2, and CF3. The color filter layer CFL may include a first filter CF1 transmitting the second color light, a second filter CF2 transmitting the third color light, and a third filter CF3 transmitting the first color light. As an example, the first filter CF1 may be a red filter, the second filter CF2 may be a green filter, and the third filter CF3 may be a blue filter. Each of the filters CF1, CF2, and CF3 may include a polymer photoresist and pigment, or a polymer photoresist and dye. The first filter CF1 may include a red pigment or dye, the second filter CF2 may include a green pigment or dye, and the third filter CF3 may include a blue pigment or dye. The present invention is not necessarily limited to this particular arrangement. According to an embodiment, the third filter CF3 might not include the pigment or the dye. The third filter CF3 may include the polymer photoresist and might not include the pigment or the dye. The third filter CF3 may be transparent. The third filter CF3 may be formed of a transparent photoresist.

In addition, according to an embodiment, the first filter CF1 and the second filter CF2 may be a yellow filter. The first filter CF1 and the second filter CF2 may be provided integrally with each other without being distinct from each other. For example, the first filter CF1 and the second filter CFR2 may be formed of a single, continuous structure. The first, second, and third filters CF1, CF2, and CF3 may correspond to the first light emitting area PXA-R, the second light emitting area PXA-G, and the third light emitting area PXA-B, respectively. In addition, the first, second, and third filters CF1, CF2, and CF3 may correspond to the first, second, and third light control portions CCP1, CCP2, and CCP3, respectively.

In addition, the filters CF1, CF2, and CF3 that transmit light having different colors may overlap each other to correspond to the non-light emitting area NPXA defined between the light emitting areas PXA-R, PXA-G, and PXA-B. The filters CF1, CF2, and CF3 may overlap in the third directional axis DR3, i.e., the thickness direction, to define a boundary between the light emitting areas PXA-R, PXA-G and PXA-B adjacent to each other. Different from that shown in FIG. 4, according to an embodiment, the color filter layer CFL may include a light blocking portion to define a boundary between the filters CF1, CF2, and CF3 adjacent to each other. The light blocking portion may be formed as the blue filter or may be formed of an organic light blocking material or an inorganic light blocking material including a black pigment or a black dye. The color filter layer CFL may include a protective layer LR. The protective layer LR may be disposed between the light control layer CCL and the filters CF1, CF2, and CF3. The protective layer LR may be disposed on the light control layer CCL to prevent the light control portions CCP1, CCP2, and CCP3 from being exposed to moisture/oxygen. In addition, the protective layer LR may be disposed between the light control portions CCP1, CCP2, and CCP3 and the filters CF1, CF2, and CF3 to serve as an optical functional layer that increases a light extraction efficiency or that prevents a reflected light from entering the light control layer CCL. The protective layer LR may be a low refractive index layer having a refractive index smaller than that of layers adjacent thereto.

The protective layer LR may include at least one inorganic layer. As an example, the protective layer LR may include silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, or a metal thin film having the light transmittance, however, the present invention is not necessarily limited to this particular arrangement. According to an embodiment, the protective layer LR may include an organic layer. As an example, the protective layer LR may include a polymer resin and inorganic particles. The protective layer LR may have a single-layer or multi-layer structure.

The filters CF1, CF2, and CF3 of the color filter layer CFL may be disposed directly on the light control layer CCL in the display device DD. In this case, the protective layer LR may be omitted.

According to an embodiment, the light control panel DP may include a base substrate BL disposed on the color filter layer CFL. The base substrate BL may provide a base surface on which the color filter layer CFL and the light control layer CCL are disposed. The base substrate BL may be a glass substrate, a metal substrate, or a plastic substrate, however, the present invention is not necessarily limited to this particular arrangement. According to an embodiment, the base substrate BL may be an inorganic layer, an organic layer, or a composite material layer. In addition, according to an embodiment, the base substrate BL may be omitted.

According to an embodiment, the foreign substance PT may be disposed between the display element layer DP-ED and the light control layer CCL. Referring to FIG. 5, the foreign substance PT may be disposed between the display panel DP and the light control layer CCL. For example, the foreign substance PT may be located on the encapsulation layer TFE, and the filling layer FML may be disposed on the encapsulation layer TFE to cover the foreign substance PT.

The filling layer FML may have an average thickness equal to or greater than about 3 μm and equal to or smaller than about 5 μm. As an example, the average thickness $t_{FM}$ of the filling layer FML in the second area NPTA in which the foreign substance PT is not disposed may be equal to or greater than about 3 μm and equal to or smaller than about 5 μm.

The filling layer FML may be disposed corresponding to the shape of the foreign substance PT. The filling layer FML may include a protruding area FML-E protruding toward the light control layer CCL in the first area PTA in which the foreign substance PT is disposed. The protruding area FML-E may have an average thickness $t_{FL-P}$ equal to or greater than about 3 μm and equal to or smaller than abut 5 μm. According to an embodiment, the filling layer FML may have a predetermined thickness or more in a foreign substance area PTA-DP of the display panel DP in which the foreign substance PT is disposed.

In the first area PTA, the filling layer FML may have a thickness $t_{FL-T}$ equal to or greater than the average thickness $t_{FM}$ of the filling layer FML in the second area NPTA. In the first area PTA in which the foreign substance PT is disposed, the filling layer FML may be disposed with a sufficient thickness to cover an uneven portion caused by the foreign substance PT, and thus, cracks generated by the foreign substance PT may be prevented from being propagated to the light control layer CCL. The thickness $t_{FL-T}$ of the filling layer FML in an area overlapping the foreign substance PT may be at least about 3 μm or more.

For example, the average thickness $t_{FL-P}$ of the filling layer in a portion overlapping the foreign substance PT in the foreign substance area PTA-DP may be equal to or greater than about 3 μm and equal to or smaller than about 5 μm, and the average thickness $t_{FL-P}$ of the filling layer in a portion overlapping the foreign substance PT may be similar to the average thickness $t_{FM}$ of the filling layer FML in the second area NPTA where the foreign substance is not presented.

The filling layer FML may be filled in between the display panel DP and the light control layer CCL and may be disposed corresponding to the uneven portion of the foreign substance area PTA-DP in which the foreign substance PT is disposed. An upper surface of the filling layer FML adjacent to the light control layer CCL may have a smooth curved surface. The filling layer FML may include the protruding area FML-E in the first area PTA and may have the smooth curved surface going to the second area NPTA from the first area PTA. Accordingly, the foreign substance PT may be covered by the filling layer FML without being exposed to the light control layer CCL, and the cracks caused by the foreign substance PT might not be propagated to the light control layer CCL.

According to an embodiment, a distance $t_{EP}$ between the display element layer DP-ED and the light control layer CCL in the first area PTA of the display device DD in which the foreign substance PT is disposed may be greater than a distance $t_{FP}$ between the display element layer DP-ED and the light control layer CCL in the second area NPTA in which the foreign substance PT is not disposed. For example, the display device DD includes the filling layer FML provided enough to cover the foreign substance area PTA-DP of the display panel DP, which is protruded by the foreign substance PT, or the foreign substance PT in the first area PTA in which the foreign substance PT is disposed, and thus, damages of the light control layer CCL or the display element layer DP-ED, which are caused by the foreign substance PT, may be reduced.

In the display device which includes the foreign substance PT having the particle size $t_{PT}$ equal to or greater than about 3 μm and equal to or smaller than about 10 μm, the light control panel OP that is the upper panel disposed on the foreign substance PT may have an upwardly convex curved shape due to the foreign substance PT. The foreign substance PT may be covered by the filling layer FML, the cracks caused by the foreign substance PT may be blocked without being propagated to the light control panel OP, and thus, a reliability of the light control panel OP may be maintained. However, all of the light control layer CCL, the color filter layer CFL, and the base substrate BL included in the light control panel OP may have an upwardly convex curved shape due to the foreign substance PT in the first area PTA in which the foreign substance PT is disposed. The lower barrier layer CAP, the light control portion CCP, the upper barrier layer CAP-T, the filter CF, and the base substrate BL, which are included in the light control panel OP and sequentially stacked, may have a similar level of average thickness in the first area PTA and the second area NPTA, however, the shape of each element of the light control panel OP may be changed to have an upwardly convex shape in the first area PTA.

FIG. 5 shows an area AA' of FIG. 4. In FIG. 5, a filter "CF" is used as a representative example of the filters CF1, CF2, and CF3 included in the color filter layer CFL, and a light control portion "CCP" is used as a representative example of the light control portions CCP1, CCP2, and CCP3. For example, features in the cross-section of the display device shown in FIG. 5 should not necessarily be limited to the area AA' in FIG. 4 and may be equally applied to the first light emitting area PXA-R and the third light emitting area PXA-B. For example in a case where the foreign substance is disposed under the light control panel OP in the first light emitting area PXA-R and the third light emitting area PXA-B, all the elements included in the light control panel OP may have the uneven portion in the area in which the foreign substance is disposed.

In addition, in the non-light emitting area NPXA, the lower barrier layer CAP, the partition pattern BMP, the upper barrier layer CAP-T, the stacked filters CF1, CF2, and CF3, and the base substrate BL, which form the light control panel OP above the foreign substance, may have a similar level of average thickness in the first area PTA where the foreign substance is disposed and the second area NPTA where the foreign substance is not disposed. However, the shape of each element of the light control panel OP above the foreign substance may be changed to have an upwardly convex shape in the first area PTA.

Figure 7A:
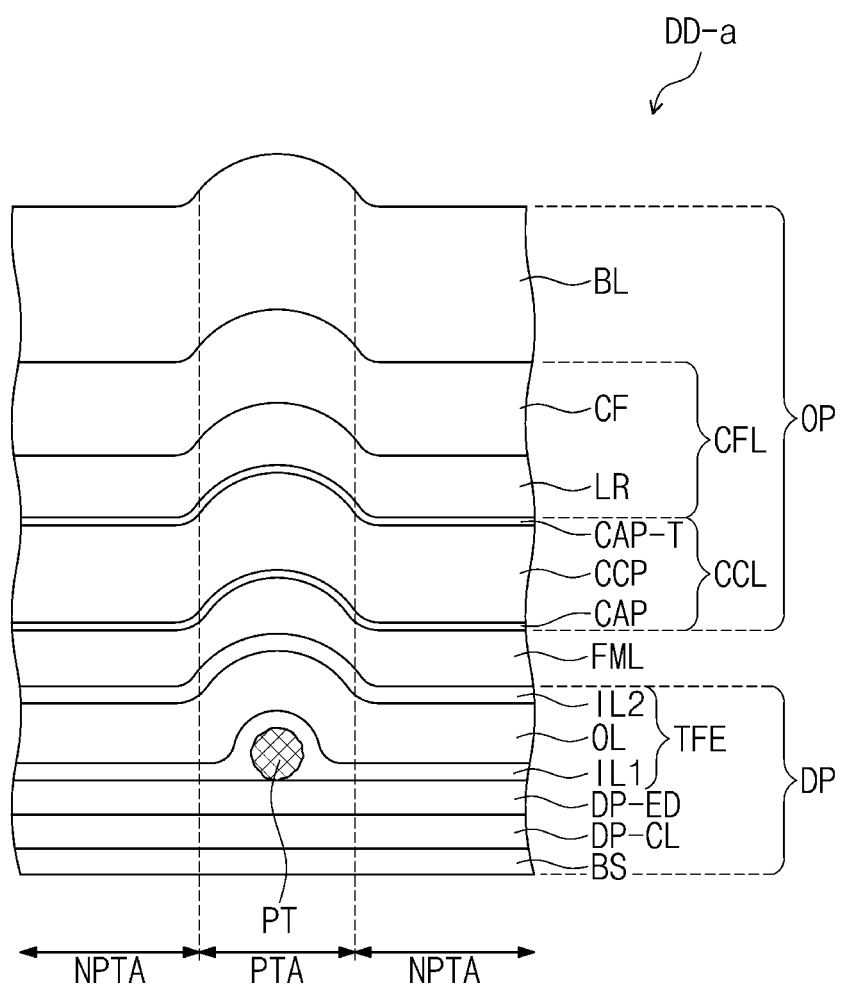
FIG. 7A is a cross-sectional view showing a portion of a display device according to an embodiment of the present disclosure.
Figure 7B:
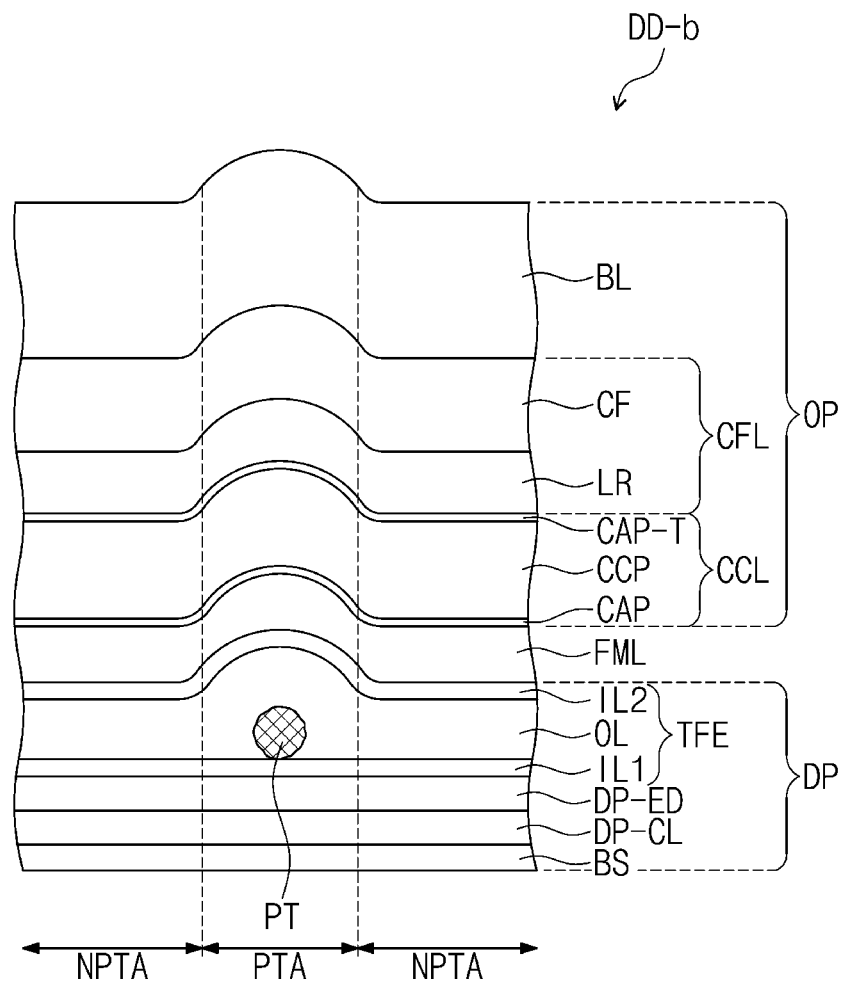
FIG. 7B is a cross-sectional view showing a portion of a display device according to an embodiment of the present disclosure.
Figure 7C:
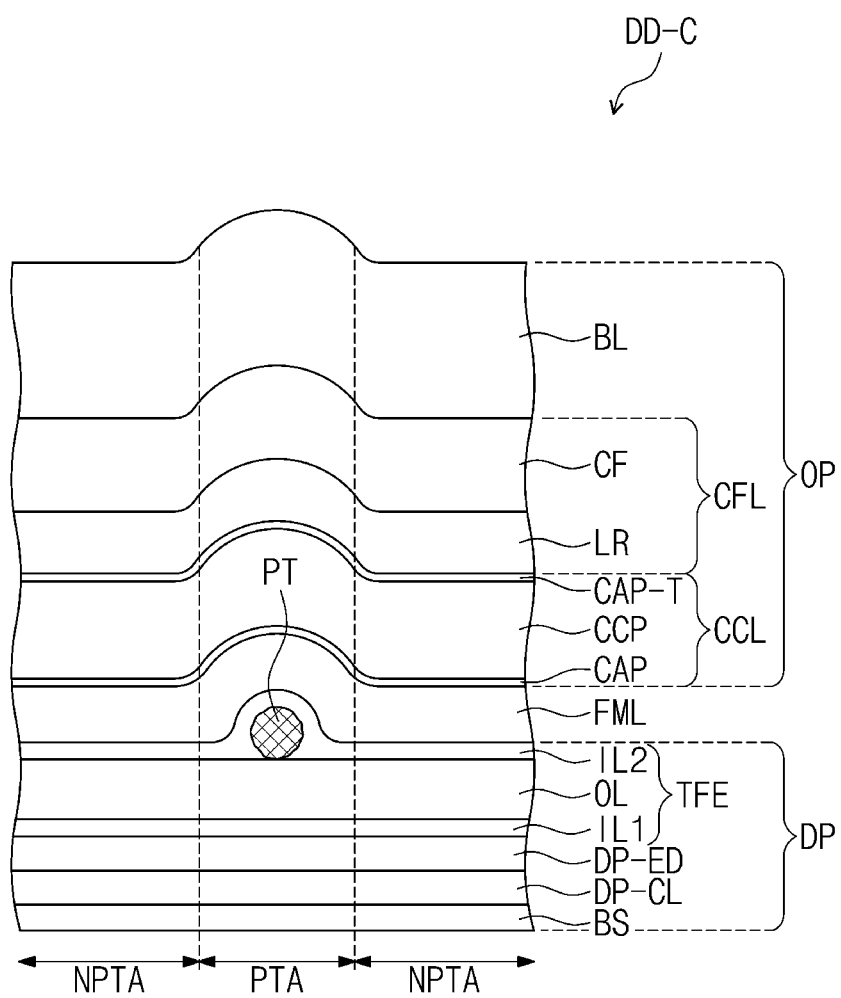
FIG. 7C is a cross-sectional view showing a portion of a display device according to an embodiment of the present disclosure.
Figure 8A:
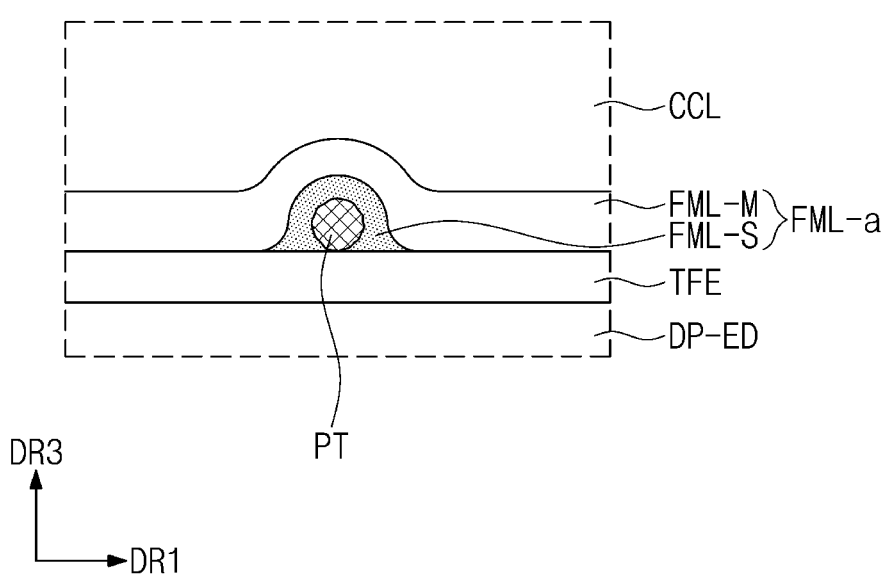
FIG. 8A is a cross-sectional view showing a portion of a display device according to an embodiment of the present disclosure.
Figure 8B:
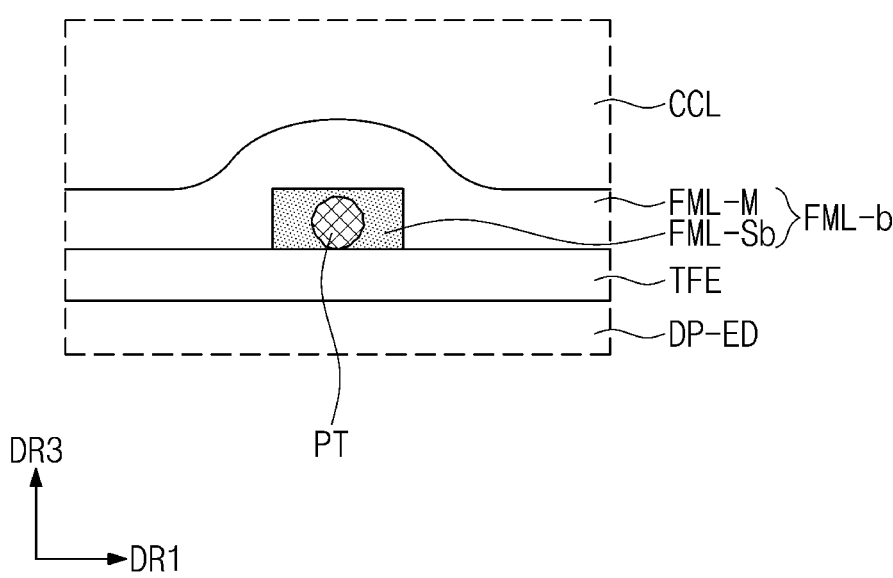
FIG. 8B is a cross-sectional view showing a portion of a display device according to an embodiment of the present disclosure.

FIGS. 7A to 7C are cross-sectional views showing a portion of display devices according to embodiments of the present disclosure. FIGS. 8A and 8B are cross-sectional views showing a portion of display devices according to embodiments of the present disclosure.

The display devices shown in FIGS. 7A to 7C have differences in position of a foreign substance compared with the display device shown in FIG. 5. The cross-sections shown in FIGS. 8A and 8B correspond to a portion of the area AA' shown in FIG. 5. The display devices shown in FIGS. 8A and 8B have differences in configuration of a filling layer compared with the display device shown in FIG. 5. Hereinafter, in describing the display devices according to embodiments with reference to FIGS. 7A to 8B, to the extent that some elements are not described in detail below, it may be assumed that these elements are at least similar to corresponding elements described above with reference to FIGS. 1 to 6.

Referring to a display device DD-a shown in FIG. 7A, a foreign substance PT may be disposed between a display element layer DP-ED and a first inorganic layer IL1. The first inorganic layer IL1, an organic layer OL, and a second inorganic layer IL2 may be provided corresponding to a shape of the foreign substance PT disposed under the first inorganic layer IL1. Referring to FIG. 7A, an encapsulation layer TFE may have an uneven portion corresponding to the shape of the foreign substance PT in a first area PTA in which the foreign substance PT is disposed. A filling layer FML disposed on the encapsulation layer TFE may have a shape protruded toward a light control layer CCL to correspond to the shape of the encapsulation layer TFE in the first area PTA. In addition, all components of a light control panel OP including the light control layer CCL and a color filter layer CFL may have an upwardly convex shape.

Referring to FIG. 7B, in a display device DD-b, a foreign substance PT may be disposed between a first inorganic layer IL1 and a second inorganic layer IL2. As an example, the foreign substance PT may be disposed in an organic layer OL. The foreign substance PT may be disposed on the first inorganic layer IL1. In the embodiment shown in FIG. 7B, the organic layer OL and the second inorganic layer IL2 may have an uneven portion corresponding to a shape of the foreign substance PT in a first area PTA in which the foreign substance PT is disposed. A filling layer FML disposed on an encapsulation layer TFE may have a shape protruded toward a light control layer CCL in the first area PTA to correspond to the uneven portion of the organic layer OL and the second inorganic layer IL2. In addition, all components of a light control panel OP including the light control layer CCL and a color filter layer CFL may have an upwardly convex shape.

Referring to a display device DD-c shown in FIG. 7C, a foreign substance PT may be disposed between an organic layer OL and a second inorganic layer IL2. The second inorganic layer IL2 may be provided corresponding to a shape of the foreign substance PT disposed thereunder. Referring to FIG. 7C, a filling layer FML disposed on an encapsulation layer TFE may have a portion protruded toward a light control layer CCL in a first area PTA to correspond to a shape of the foreign substance PT and a shape of the second inorganic layer IL2. In addition, all components of a light control panel OP including the light control layer CCL and a color filter layer CFL may have an upwardly convex shape.

FIGS. 5, and 7A to 7C show structures of the display devices according to the position of the foreign substance PT, however, the present invention is not necessarily limited to this particular arrangement. The foreign substance PT may be introduced after a process to form the display element layer DP-ED starts and before the light control panel OP is provided, and the foreign substance PT may be disposed between the display element layer DP-ED and the light control layer CCL without being limited to a specific location. FIGS. 5 and 7A to 7C show the structures of the display devices in the case only one foreign substance PT is introduced as a representative example. However, the foreign substance PT should not be limited to the above-described shape and size, and a plurality of foreign substances PT may be provided. As an example, the foreign substances PT may be detected at all the positions of the foreign substances PT shown in FIGS. 5 and 7A to 7C.

The filling layer FML shown in FIGS. 5 and 7A to 7C may be integrally provided in the first area PTA and the second area NPTA and may be filled in between the display panel DP and the light control panel OP while surrounding a periphery of the foreign substance PT. For example the filling layer FML around the foreign substance PT and the filling layer FML spaced apart from the foreign substance PT may be formed of the same material. However, according to an embodiment, the filling layer FML around the foreign substance PT and the filling layer FML spaced apart from the foreign substance PT may be formed of different materials from each other.

Referring to FIGS. 8A and 8B, filling layers FML-a and FML-b may include auxiliary filling portions FML-S and FML-Sb adjacent to a foreign substance PT and a main filling portion FML-M spaced apart from the foreign substance PT. The auxiliary filling portions FML-S and FML-Sb may cover the foreign substance PT. In addition, the main filling portion FML-M may cover the auxiliary filling portions FML-S and FML-Sb. As shown in FIG. 8A, the auxiliary filling portion FML-S may be provided corresponding to a shape of the foreign substance PT, or as shown in FIG. 8B, the auxiliary filling portion FML-Sb may have a specific shape that is not necessarily limited to the shape of the foreign substance PT as long as the auxiliary filling portion FML-Sb may cover the foreign substance PT.

The auxiliary filling portions FML-S and FML-Sb and the main filling portion FML-M may include different materials from each other. Different from the above, the auxiliary filling portions FML-S and FML-Sb and the main filling portion FML-M may include the same material as each other and may be integrally formed with each other.

The main filling portion FML-M may be formed of a filling resin including an epoxy resin. The auxiliary filling portions FML-S and FML-Sb may be formed of an auxiliary filling resin including an epoxy resin and an organic bead. The organic bead included in the auxiliary filling resin may be formed of a polymer material. As an example, the organic bead may be an organic polymer bead and may be formed of polystyrene (PS), polymethylmethacrylate (PMMA), or other cross-linked polymer materials. Since the auxiliary filling resin includes the organic bead, the auxiliary filling portions FML-S and FML-Sb may maintain a predetermined height around the foreign substance PT, and thus, a height of the filling layer FML may be maintained around the foreign substance PT. According to an embodiment, the filling layer FML may maintain a predetermined height in an area in which the foreign substance PT is disposed, and defects such as cracks caused by the foreign substance PT may be reduced.

The auxiliary filling resin may further include a moisture absorbent substance as an additive. The moisture absorbent substance may be used as the auxiliary filling resin with the epoxy resin. The auxiliary filling portions FML-S and FML-Sb formed of the auxiliary filling resin including the moisture absorbent substance may prevent moisture from entering a light control layer or a display element layer adjacent thereto, and thus the reliability of the display device may be increased.

The epoxy resin used in the auxiliary filling resin may be substantially the same as the epoxy resin used to form the main filling portion FML-M, however, the present invention is not necessarily limited to this particular arrangement. According to an embodiment, the epoxy resin used to form the main filling portion FML-M and the epoxy resin used to form the auxiliary filling portions FML-S and FML-Sb may be different from each other. The epoxy resin used to form the main filling portion FML-M and the epoxy resin used to form the auxiliary filling portions FML-S and FML-Sb may include different epoxy resin materials from each other. The expression "the epoxy resins include different epoxy resin materials from each other" may mean that the structures of the epoxy compounds included in the epoxy resins are different from each other.

The epoxy resin used to form the main filling portion FML-M may be substantially the same as the epoxy resin used to form the auxiliary filling portions FML-S and FML-Sb, and the epoxy resin used to form the main filling portion FML-M and the epoxy resin used to form the auxiliary filling portions FML-S and FML-Sb may have a difference only in viscosity. As an example, the main filling portion FML-M may be formed of a filling resin including a first epoxy resin, and the auxiliary filling portions FML-S and FML-Sb may be formed of an auxiliary filling resin including a second epoxy resin with a viscosity that is higher than that of the first epoxy resin. The height of the filling layer FML around the foreign substance PT may be maintained by applying the epoxy resin with a relatively high viscosity around the foreign substance PT. Accordingly, the filling layer FML may maintain the predetermined height in the area in which the foreign substance PT is disposed, and thus, defects such as cracks caused by the foreign substance PT may be reduced.

Hereinafter, a method of manufacturing the display device will be described with reference to FIGS. 9A, 9B, 10, and 11A to 11C. In describing the manufacturing method of the display devices with reference to FIGS. 9A to 11C, to the extent that some elements are not described in detail below, it may be assumed that these elements are at least similar to corresponding elements described above with reference to FIGS. 1 to 8B.

Figure 9A:
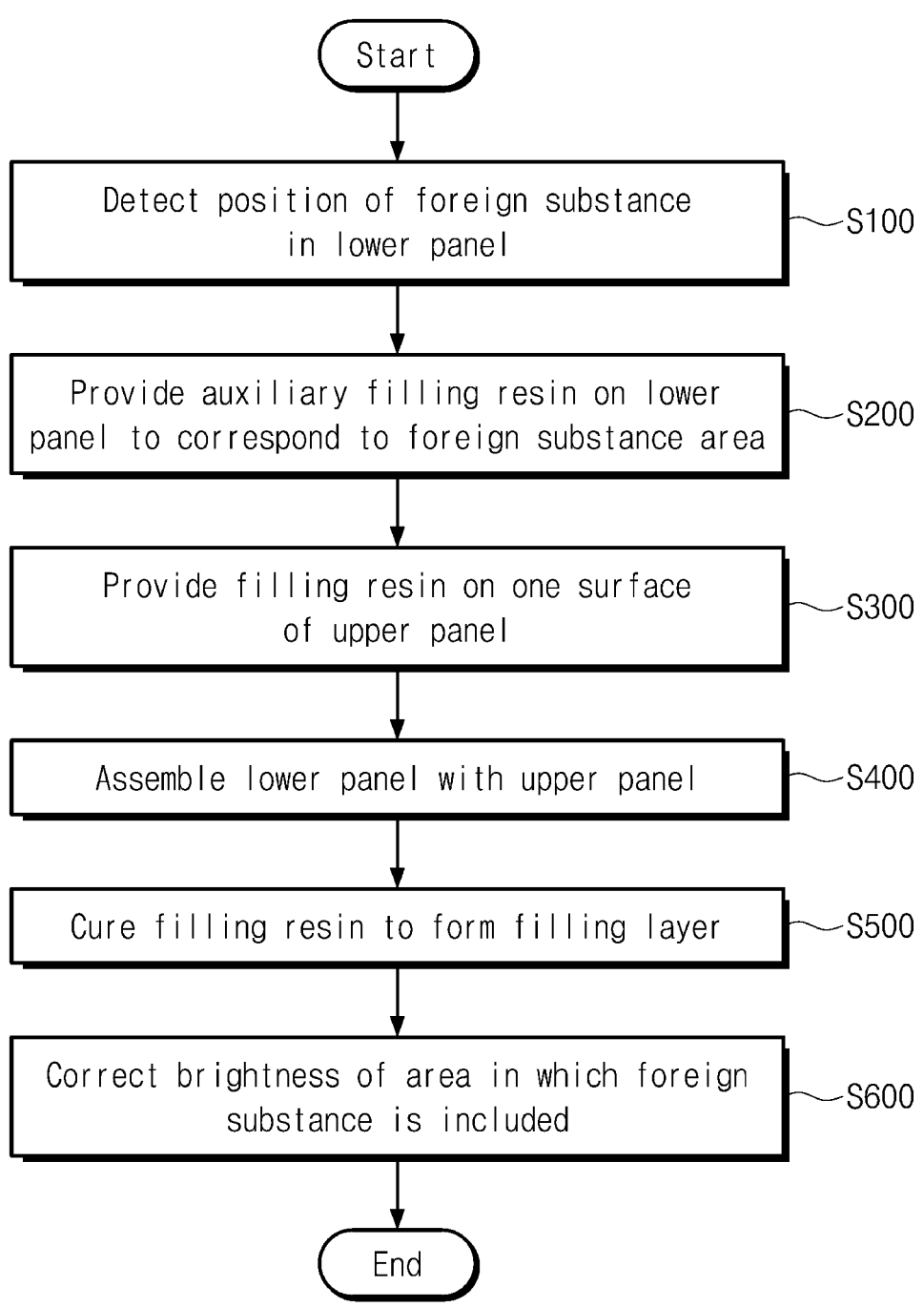
FIG. 9A is a flowchart showing a method of manufacturing a display device according to an embodiment of the present disclosure.
Figure 9B:
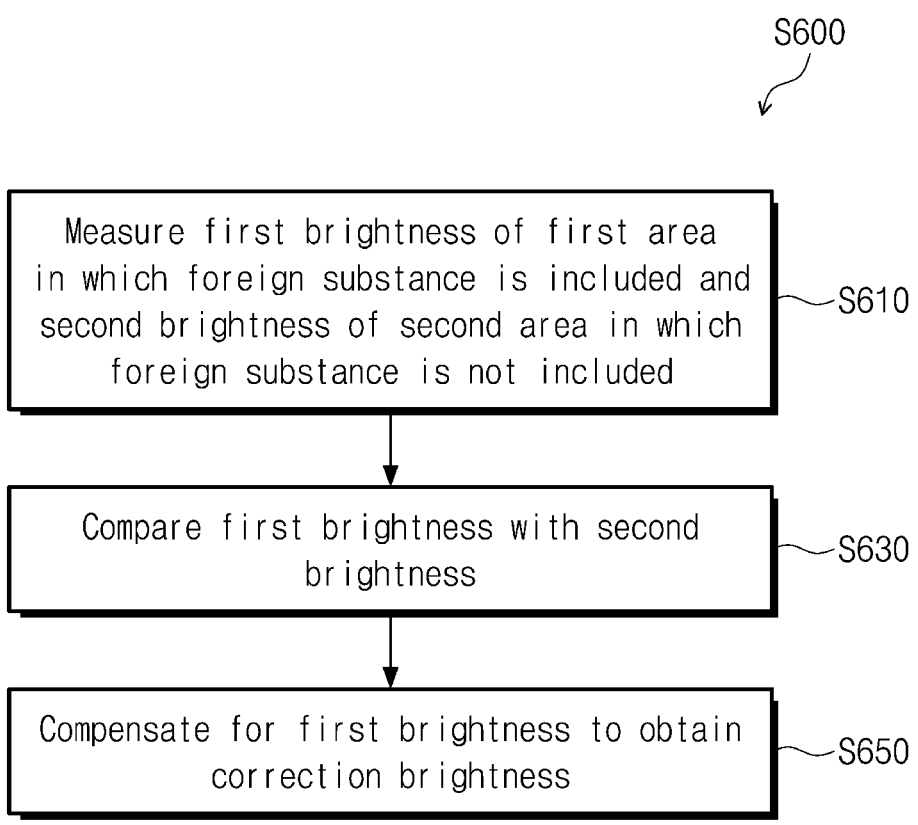
FIG. 9B is a flowchart showing a method of manufacturing a display device according to an embodiment of the present disclosure.
Figure 10:
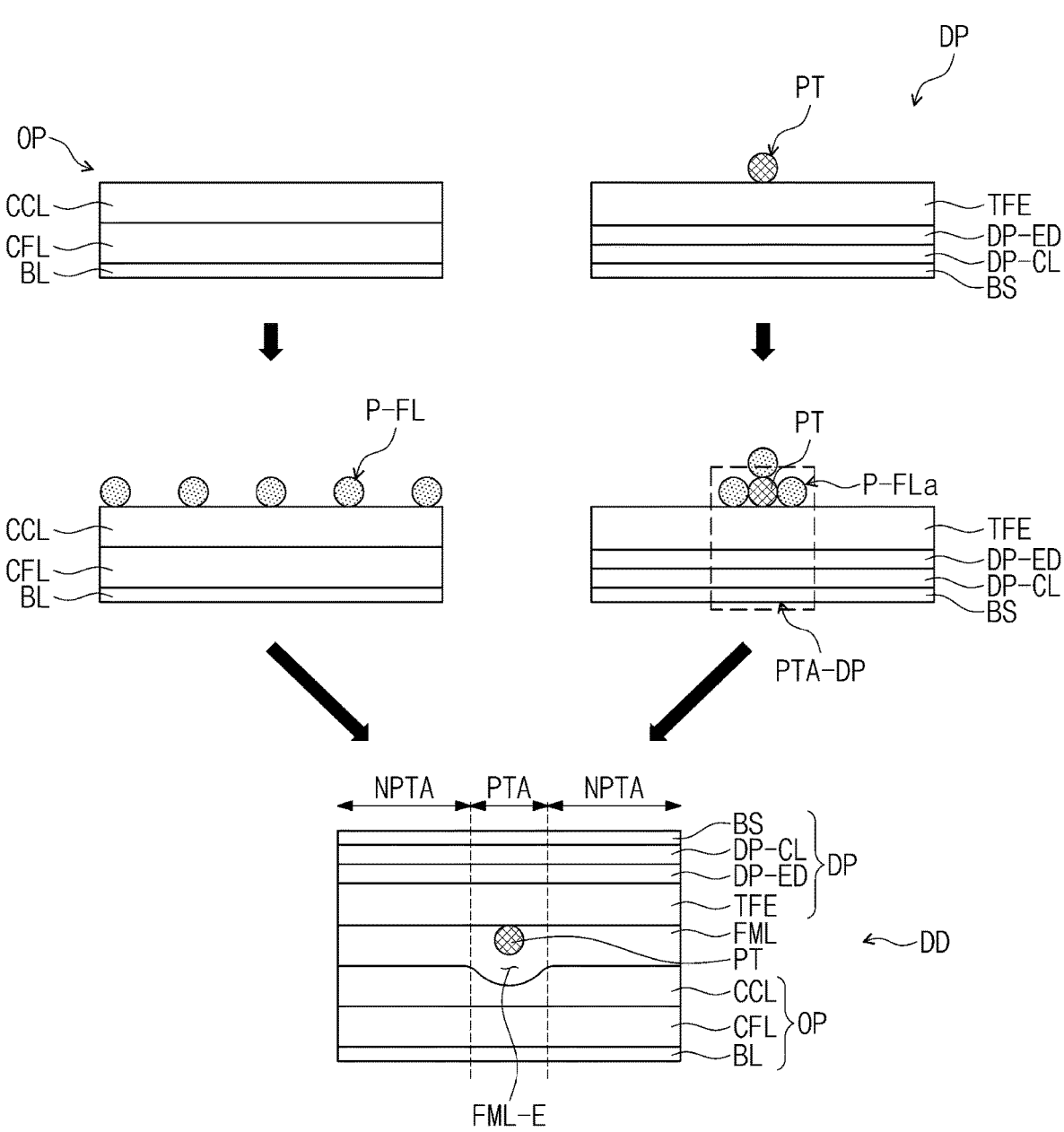
FIG. 10 is a view showing some processes of a method of manufacturing a display device according to an embodiment of the present disclosure.

FIG. 9A is a flowchart showing a method of manufacturing the display device according to an embodiment of the present disclosure. FIG. 9B is a flowchart showing some processes of the method of manufacturing the display device according to an embodiment of the present disclosure. FIG. 10 is a view showing some processes of the method of manufacturing the display device according to an embodiment of the present disclosure. FIG. 10 shows a structure in which the foreign substance PT is disposed on the encapsulation layer TFE, however, the present invention is not necessarily limited to this particular arrangement. According to an embodiment, the foreign substance PT may be disposed between the display element layer DP-ED and the encapsulation layer TFE or in the encapsulation layer TFE, and even in this case, the manufacturing method of the display device may be performed through the same processes as those shown in FIG. 10.

The manufacturing method of the display device may include detecting the position of the foreign substance in the lower panel (S100), providing the auxiliary filling resin on the lower panel to correspond to the foreign substance area (S200), providing the filling resin on one surface of the upper panel (S300), assembling the lower panel with the upper panel (S400), curing the filling resin to form the filling layer (S500), and correcting a brightness of the area in which the foreign substance is included (S600).

In addition, the correcting of the brightness (S600) may include measuring a first brightness of the first area in which the foreign substance is included and a second brightness of the second area in which the foreign substance is not included (S610), comparing the first brightness with the second brightness (S630), and compensating for the first brightness to obtain a correction brightness (S650).

The detecting of the foreign substance in the lower panel (S100) may be detecting the foreign substance in the display panel. The detecting of the foreign substance in the display panel (S100) may be detecting the position of the foreign substance in the display panel DP including the foreign substance area PTA-DP in which the foreign substance PT is disposed. The position of the foreign substance may be detected by an optical method. The position of the foreign substance may be detected by the optical method using a laser beam and may be performed before the encapsulation layer TFE is provided or before and after each of the inorganic layers IL1 and IL2 (refer to FIG. 6) and the organic layer OL that are included in the encapsulation layer TFE.

The auxiliary filling resin P-FLa may be provided to correspond to the foreign substance area PTA-DP in which the foreign substance PT is disposed. After the detecting of the foreign substance in the lower panel (S100), the providing of the auxiliary filling resin on the lower panel to correspond to the foreign substance area (S200) may be performed. The providing of the auxiliary filling resin on the lower panel to correspond to the foreign substance area (S200) may be providing the auxiliary filling resin on the light control panel to correspond to the foreign substance area. In the providing of the auxiliary filling resin on the lower panel to correspond to the foreign substance area (S200), the auxiliary filling resin P-FLa may be provided around the foreign substance PT. The auxiliary filling resin P-FLa may include the epoxy resin or the epoxy resin with an additive. The auxiliary filling resin P-FLa may include the organic bead or the moisture absorbent as the additive.

The auxiliary filling resin P-FLa may be provided in a dot shape to be adjacent to the foreign substance PT in the foreign substance area PTA-DP. The auxiliary filling resin P-FLa may be provided in the form of a plurality of dots to surround the foreign substance PT, however, the present invention is not necessarily limited to this particular arrangement. According to an embodiment, the auxiliary filling resin P-FLa may be provided in various forms without being limited to the dot shape as long as an amount the auxiliary filling resin P-FLa may allow the filling layer to have the predetermined height around the foreign substance PT. The auxiliary filling resin P-FLa may be provided on the display panel DP and may be cured before the assembling process. In addition, different from the above, the auxiliary filling resin P-FLa may be cured in the same process as that of the filling resin after the filling resin is provided and the display panel is coupled with the light control panel.

The providing of the filling resin on the one surface of the lower panel (S300) may be providing the filling resin on one surface of the light control panel. The providing of the filling resin on the one surface of the light control panel (S300) may be providing the filling resin P-FL on the one surface facing the display panel DP in the light control panel OP including the light control layer CCL. The filling resin P-FL may be provided in a dot shape over the one surface of the light control layer CCL adjacent to the display panel DP. As an example, the filling resin P-FL may include the epoxy resin.

The assembling of the lower panel with the upper panel (S400) may be assembling the display panel with the light control panel. The assembling of the display panel with the light control panel (S400) may be assembling the light control panel OP to which the filling resin P-FL is provided with the display panel DP to which the auxiliary filling resin P-FLa is provided. The assembling of the display panel DP with the light control panel OP may be performed using a vacuum coupling system. In the assembling of the display panel DP with the light control panel OP using the vacuum coupling system, bubbles may be effectively removed. In addition, when the assembling process is performed by the vacuum coupling system, a stability of the filling resin P-FL and the auxiliary filling resin P-FLa may be maintained.

After the assembling of the display panel with the light control panel (S400), the curing of the filling resin may be performed to form the filling layer (S500). The filling resin P-FL disposed between the display panel DP and the light control panel OP assembled with the display panel DP may be cured through a light or heat curing process, and thus the filling layer FML may be formed. The auxiliary filling resin P-FLa may be cured through the same process as the filling resin P-FL in the curing of the filling resin to form the filling layer (S500). In addition, different from the above, the auxiliary filling resin P-FLa may be cured while being disposed on the display panel DP before the assembling of the display panel with the light control panel (S400).

After the curing of the filling resin to form the filling layer (S500), the display device DD including the display panel DP, the light control panel OP, and the filling layer FML disposed between the display panel DP and the light control panel OP may be provided. The provided display device DD may include the first area PTA in which the foreign substance is disposed and the second area NPTA in which the foreign substance is not disposed. The filling layer FML may include the protruding area FML-E protruded toward the light control layer CCL in the area in which the foreign substance PT is disposed.

According to an embodiment, the manufacturing method of the display device may include the correcting of the brightness in the area in which the foreign substance is included in the display device DD that includes the display panel DP, the light control panel OP, and the filling layer FML disposed between the display panel DP and the light control panel OP (S600).

In the correcting of the brightness of the area in which the foreign substance is included (S600), the first brightness of the first area in which the foreign substance is included and the second brightness of the second area in which the foreign substance is not included may be measured at the same grayscale level through the measuring process (610). Then, the comparing of the measured first brightness with the measured second brightness (S630) and the compensating for the first brightness to obtain the correction brightness (S650) may be performed.

Figure 11A:
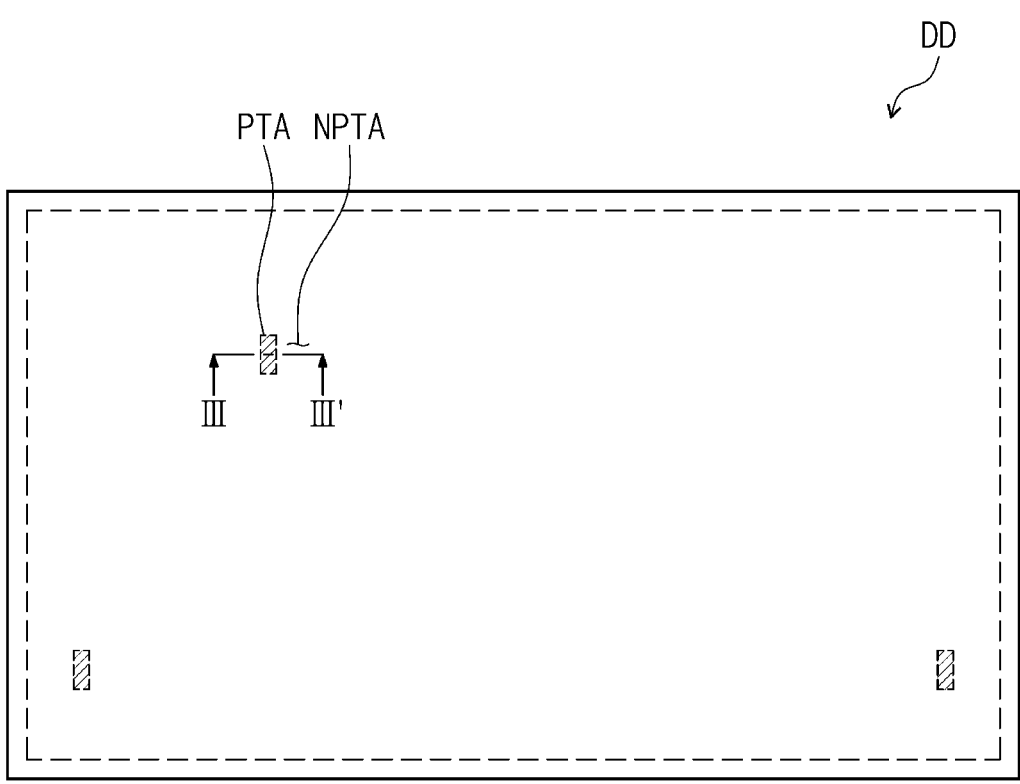
FIG. 11A is a plan view showing a display device according to an embodiment of the present disclosure.
Figure 11A:
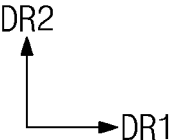
Figure 11B:
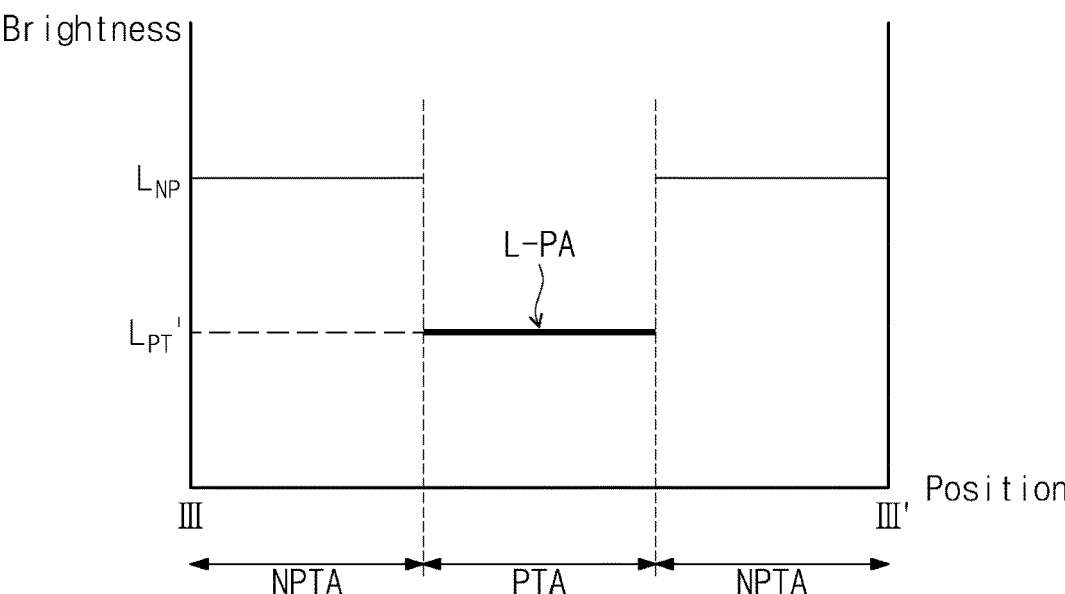
FIG. 11B is a view showing a brightness value in a display device according to an embodiment of the present disclosure.
Figure 11C:
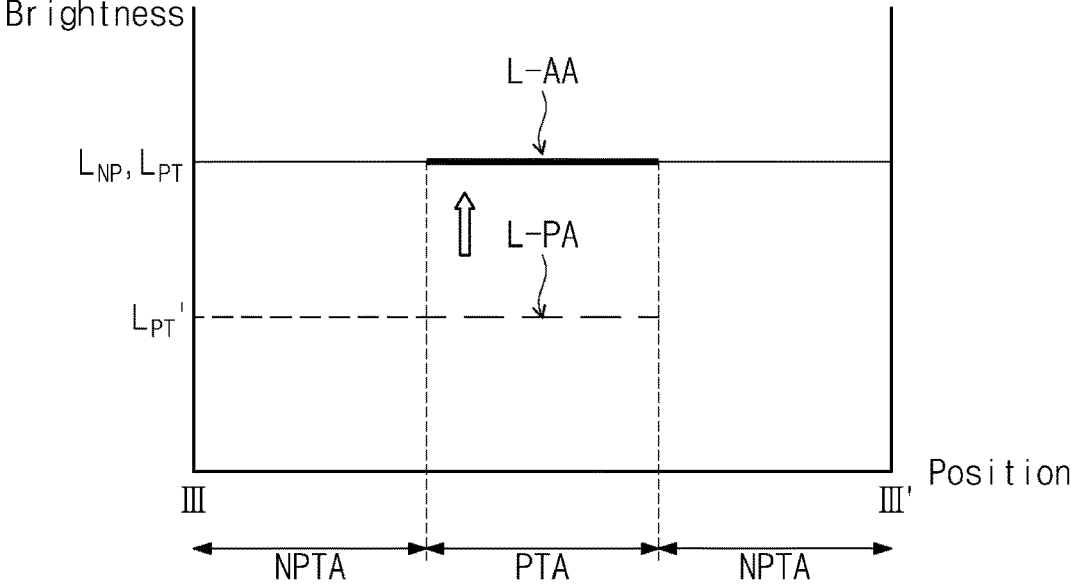
FIG. 11C is a view showing a brightness value in a display device according to an embodiment of the present disclosure.

FIGS. 11A to 11C are views showing the correcting of the brightness of the area in which the foreign substance is included. FIG. 11A is a plan view showing the display device DD according to an embodiment of the present disclosure. The display device DD may include the first area PTA in which the foreign substance is disposed. The brightness of the first area PTA in which the foreign substance is disposed may be lower than the brightness of the second area NPTA in which the foreign substance is not disposed under the same grayscale level.

Since a distance gap between the display element layer and a light control element increases in the first area PTA in which the foreign substance is disposed, the brightness of the first area PTA may be lower than that of the second area NPTA in which the foreign substance is not disposed under the same grayscale level. For example, the first area PTA in which the foreign substance is disposed may be represented as a black spot. In this case, the brightness of the first area PTA may be compensated for with respect to a brightness value of the second area NPTA adjacent thereto.

FIGS. 11B and 11C are views showing a brightness of a portion corresponding to a line III-III' of FIG. 11A. FIG. 11B shows a comparison of the brightness value of the first area PTA with that of the second area NPTA before the compensating for the first brightness to obtain the correction brightness (S650). FIG. 11C shows a comparison of the brightness value of the first area PTA with that of the second area NPTA after the compensating for the first brightness to obtain the correction brightness (S650) at the same point. FIGS. 11B and 11C show a comparison of the brightness values when the first area PTA and the second area NPTA are driven to have the same gray level.

Referring to FIG. 11B, a first brightness value $L_{PT}'$ of a brightness level L-PA in the first area PTA may be smaller than a second brightness value $L_{NP}$ in the second area NPTA. For example, when the first area PTA and the second area NPTA receive the same voltage, the first area PTA in which the foreign substance is disposed may have a lower brightness value than that of the second area NPTA.

FIG. 11C shows the comparison of the brightness values after the compensating for the first brightness to obtain the correction brightness (S650). Referring to FIG. 11C, the first brightness value $L_{PT}'$ of the brightness level L-PA in the first area PTA before the compensating process may be compensated for such that a correction brightness value $L_{PT}$ of a brightness level L-AA, which is similar to the second brightness value $L_{NP}$ in the second area NPTA, is obtained after the compensating process. For example a correction value may be calculated in the comparing of the first brightness of the first area with the second brightness of the second area and may be stored in a memory. Then, the first brightness of the first area may be compensated for to obtain the correction brightness using the correction value stored in the memory.

Accordingly, a deterioration in display quality, due to stains or black dots, which are caused by the difference in gap between the area in which the foreign substance is disposed and the area in which the foreign substance is not disposed, may be reduced in the display device. Accordingly, the display device including the filling layer that sufficiently covers around the foreign substance may have increased reliability and may maintain increased display quality by compensating for the brightness.

The display device may include the first area in which the foreign substance is disposed and the second area in which the foreign substance is not disposed and may include the filling layer filled in between the display panel and the light control panel. In the display device, the distance between the display element layer and the light control layer in the first area may be greater than the distance between the display element layer and the light control layer in the second area, and thus, the propagation of the cracks caused by the foreign substance may be prevented, thereby increasing the reliability. In addition, the manufacturing method of the display device may include the compensating for the brightness of the first area in which the foreign substance is disposed to obtain the brightness of the second area in which the foreign substance is not disposed. Accordingly, the uniform brightness value may be even in the area in which the foreign substance is disposed, and thus the display device with superior display quality may be manufactured.

Although the embodiments of the present disclosure have been described, it is understood that the present disclosure is not necessarily limited to these embodiments but various changes and modifications can be made by one ordinary skilled in the art within the spirit and scope of the present disclosure.

What is claimed is:

1. A method of manufacturing a display device, comprising:
detecting a position of a foreign substance in a foreign substance area of a lower panel;
providing an uncured auxiliary filling resin on the lower panel to correspond to the foreign substance area;
providing an uncured filling resin on one surface of an upper panel comprising a light control layer, the uncured filling resin being disposed between the uncured auxiliary filling resin and the upper panel and contacting the uncured auxiliary filling resin;
arranging the lower panel to the upper panel;
curing the uncured auxiliary filing resin together with the uncured filling resin disposed between the lower panel and the upper panel arranged to the lower panel to form a cured filling layer through a light or heat curing process; and
correcting a brightness of an area in which the foreign substance is included.

2. The method of claim 1, wherein the correcting of the brightness comprises:
measuring a first brightness of a first area in which the foreign substance is included and a second brightness of a second area in which the foreign substance is not included;
comparing the first brightness of the first area with the second brightness of the second area; and
compensating for the first brightness to obtain a correction brightness with respect to the second brightness.

3. The method of claim 1, wherein the uncured auxiliary filling resin is a same material as the uncured filling resin.

4. The method of claim 1, wherein the uncured auxiliary filling resin is provided in a dot shape in the foreign substance area adjacent to the foreign substance.

5. The method of claim 1, wherein the uncured filling resin is provided in a dot shape over one surface of the light control layer adjacent to the lower panel.

* * * * *